United States Patent
Anzai

(10) Patent No.: US 12,480,199 B2
(45) Date of Patent: Nov. 25, 2025

(54) METAL MASK AND METHOD FOR MANUFACTURING METAL MASK

(71) Applicant: Dai Nippon Printing Co., Ltd., Tokyo (JP)

(72) Inventor: Yuji Anzai, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 443 days.

(21) Appl. No.: 18/191,107

(22) Filed: Mar. 28, 2023

(65) Prior Publication Data

US 2023/0313360 A1 Oct. 5, 2023

(30) Foreign Application Priority Data

Mar. 31, 2022 (JP) ................................ 2022-058431

(51) Int. Cl.
  *C23C 14/04* (2006.01)
  *C23C 14/24* (2006.01)
  *H10K 71/16* (2023.01)

(52) U.S. Cl.
  CPC ............ *C23C 14/042* (2013.01); *C23C 14/24* (2013.01); *H10K 71/166* (2023.02)

(58) Field of Classification Search
  None
  See application file for complete search history.

(56) References Cited

U.S. PATENT DOCUMENTS

| | | | |
|---|---|---|---|
| 11,649,539 B2* | 5/2023 | Higuchi | H10K 71/621 257/773 |
| 2003/0152691 A1* | 8/2003 | Baude | H05K 3/143 118/721 |
| 2014/0065355 A1* | 3/2014 | Kang | C23C 14/042 428/137 |
| 2016/0293844 A1* | 10/2016 | Takeda | C23C 16/042 |
| 2017/0130320 A1* | 5/2017 | Kobayashi | H10K 71/164 |
| 2020/0308688 A1* | 10/2020 | Ikenaga | C23F 1/00 |

FOREIGN PATENT DOCUMENTS

JP 2015-163734 A 9/2015

* cited by examiner

*Primary Examiner* — Jason Berman
(74) *Attorney, Agent, or Firm* — BURR PATENT LAW, PLLC

(57) ABSTRACT

A metal mask in which shadow is less likely to occur while the strength is kept, and a method for manufacturing the metal mask are provided. The metal mask includes a first surface, and a second surface positioned opposite to the first surface. The first surface has through-holes, a first top part, and a second top part. The through-holes have a first through-hole, a second through-hole, a third through-hole, a fourth through-hole, a fifth through-hole, and a sixth through-hole. The first through-hole has a first short axis and a first long axis. The second through-hole has a second short axis and a second long axis. The third through-hole has a third short axis and a third long axis. The fourth through-hole has a fourth short axis and a fourth long axis. The fifth through-hole has a fifth short axis and a fifth long axis.

6 Claims, 18 Drawing Sheets

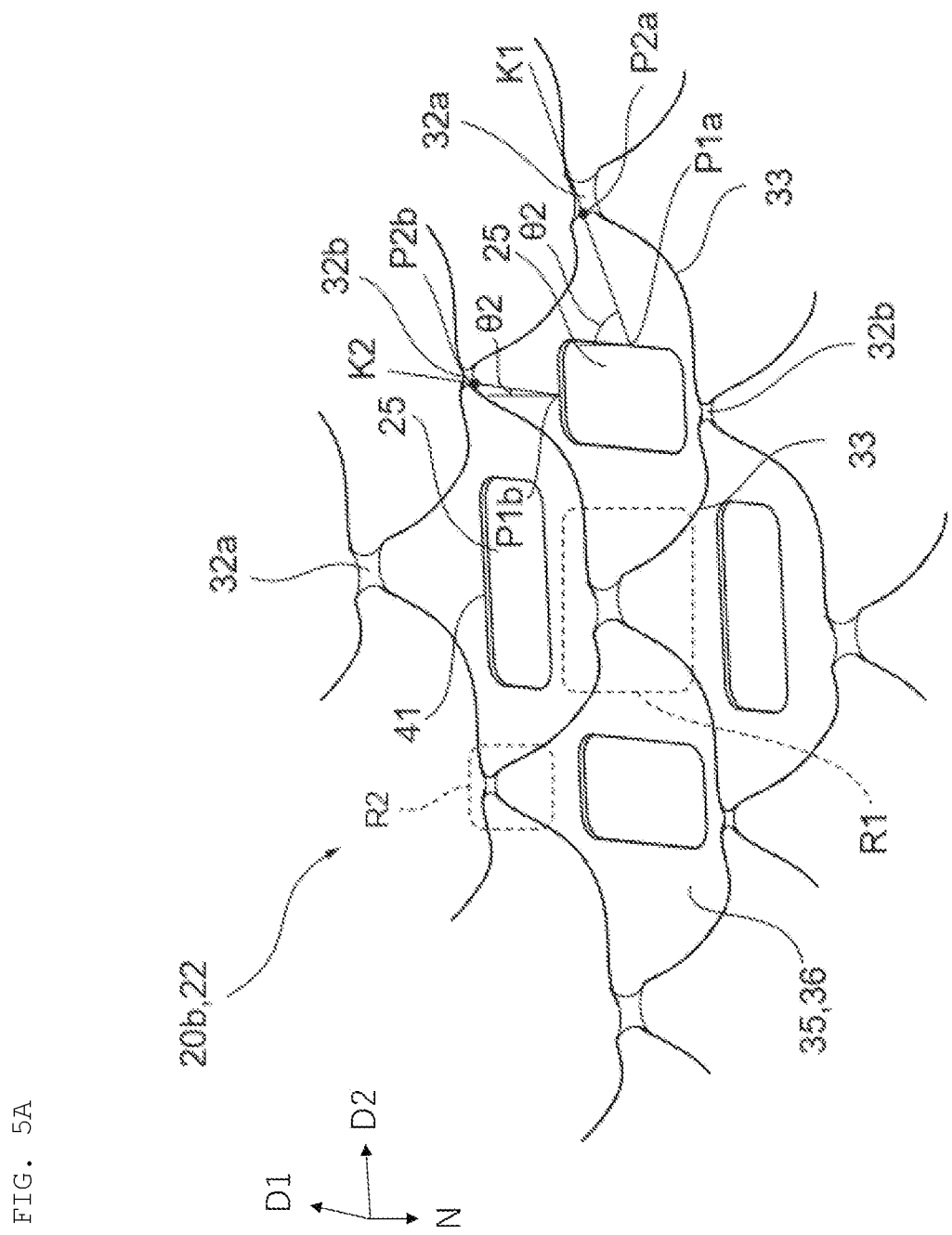

METAL MASK AND METHOD FOR MANUFACTURING METAL MASK

BACKGROUND OF THE INVENTION

Field of the Invention

The present disclosure relates to a metal mask and a method for manufacturing the metal mask.

Description of the Related Art

Pixels of an organic EL display device are formed by causing a material for forming pixels to adhere to a substrate by vapor deposition using a metal mask. Thus, improvement of performance of the metal mask is important for improving the image quality of the organic EL display device.

For example, Japanese Patent Laid-Open No. 2015-163734 discloses a method for manufacturing a metal mask in which through-holes can be formed accurately.

A metal mask has an effective region in which through-holes are disposed, and a peripheral region positioned around the effective region, for example. Such a metal mask is installed on a frame and used for vapor deposition of pixels.

In a vapor deposition step, a vapor deposition material from a vapor deposition source to the metal mask moves in a thickness direction of a metal plate constituting the metal mask. Part of the vapor deposition material moves in a direction inclined with respect to the thickness direction along a wall surface that defines a through-hole in the metal plate. The part of the vapor deposition material moving in the direction inclined with respect to the thickness direction of the metal plate adheres to the wall surface of the through-hole rather than to a substrate. Thus, a vapor deposition layer formed on the substrate is likely to be thin at a position close to the wall surface of the through-hole. Such a phenomenon in which adhesion of the vapor deposition material to the substrate is inhibited by the wall surface of the through-hole is also referred to as shadow.

To prevent shadow, it is considered to reduce the thickness of the metal plate constituting the metal mask. However, reducing the thickness of the metal plate degrades the strength. This may raise another problem such as easy deformation of the metal mask in the vapor deposition step.

The present disclosure has been made in view of the above-described problems, and has an object to provide a metal mask in which shadow is less likely to occur while the strength is kept, and a method for manufacturing the metal mask.

SUMMARY OF THE INVENTION

A metal mask of one embodiment of the present disclosure is a metal mask including a first surface, and a second surface positioned opposite to the first surface, wherein the first surface has through-holes, a first top part, and a second top part,
   the through-holes have a first through-hole, a second through-hole, a third through-hole, a fourth through-hole, a fifth through-hole, and a sixth through-hole,
   the first through-hole has a first short axis and a first long axis,
   the second through-hole has a second short axis and a second long axis,
   the third through-hole has a third short axis and a third long axis,
   the fourth through-hole has a fourth short axis and a fourth long axis,
   the fifth through-hole has a fifth short axis and a fifth long axis,
   the sixth through-hole has a sixth short axis and a sixth long axis,
   the first long axis is parallel to the second long axis and positioned next to the second long axis in a direction D2 crossing the first long axis,
   the first short axis is parallel to the fifth short axis and positioned next to the fifth short axis in a direction D1 parallel to the first long axis,
   the third long axis is parallel to the fourth long axis and positioned next to the fourth long axis in the direction D1 parallel to the first long axis,
   the third short axis is parallel to the sixth short axis and positioned next to the sixth short axis in the direction D2 crossing the first long axis,
   the first top part is positioned between the first long axis and the second long axis and between the third long axis and the fourth long axis,
   the second top part is positioned between the first short axis and the fifth short axis and between the third short axis and the sixth short axis, and
   a ratio (S2/S1) of an area S2 of a top of the second top part to an area S1 of a top of the first top part is 0.65 or less.

A method for manufacturing the above-described metal mask according to one embodiment of the present disclosure includes:

a step of preparing a metal plate including a first surface and a second surface positioned opposite to the first surface; and an etching step of etching the metal plate to form the metal mask, wherein the metal mask has the first surface and the second surface positioned opposite to the first surface,
the first surface has the through-holes, the first top part, and the second top part,
the through-holes have the first through-hole, the second through-hole, the third through-hole, the fourth through-hole, the fifth through-hole, and the sixth through-hole,
the first through-hole has the first short axis and the first long axis,
the second through-hole has the second short axis and the second long axis,
the third through-hole has the third short axis and the third long axis,
the fourth through-hole has the fourth short axis and the fourth long axis,
the fifth through-hole has the fifth short axis and the fifth long axis,
the sixth through-hole has the sixth short axis and the sixth long axis,
the first long axis is parallel to the second long axis and positioned next to the second long axis in the direction D2 crossing the first long axis,
the first short axis is parallel to the fifth short axis and positioned next to the fifth short axis in the direction D1 parallel to the first long axis,
the third long axis is parallel to the fourth long axis and positioned next to the fourth long axis in the direction D1 parallel to the first long axis,
the third short axis is parallel to the sixth short axis and positioned next to the sixth short axis in the direction D2 crossing the first long axis, the first top part is positioned between the first long axis and the second long axis and between the third long axis and the fourth long axis, the second top part is positioned between the first short axis and the fifth short axis and between the third short axis and the sixth short axis, and the ratio (S2/S1) of the area S2 of the top of the second top part to the area S1 of the top of the first top part is 0.65 or less.

Advantageous Effects of Invention

In at least one embodiment of the present disclosure, a metal mask in which shadow is less likely to occur while the strength is kept, and a method for manufacturing the metal mask can be provided.

BRIEF DESCRIPTION OF THE DRAWINGS

FIG. 5A is a perspective view of an effective region of the metal mask according to the one embodiment of the present disclosure as seen from a second surface side;

DETAILED DESCRIPTION OF THE PREFERRED EMBODIMENT

Figure 1:
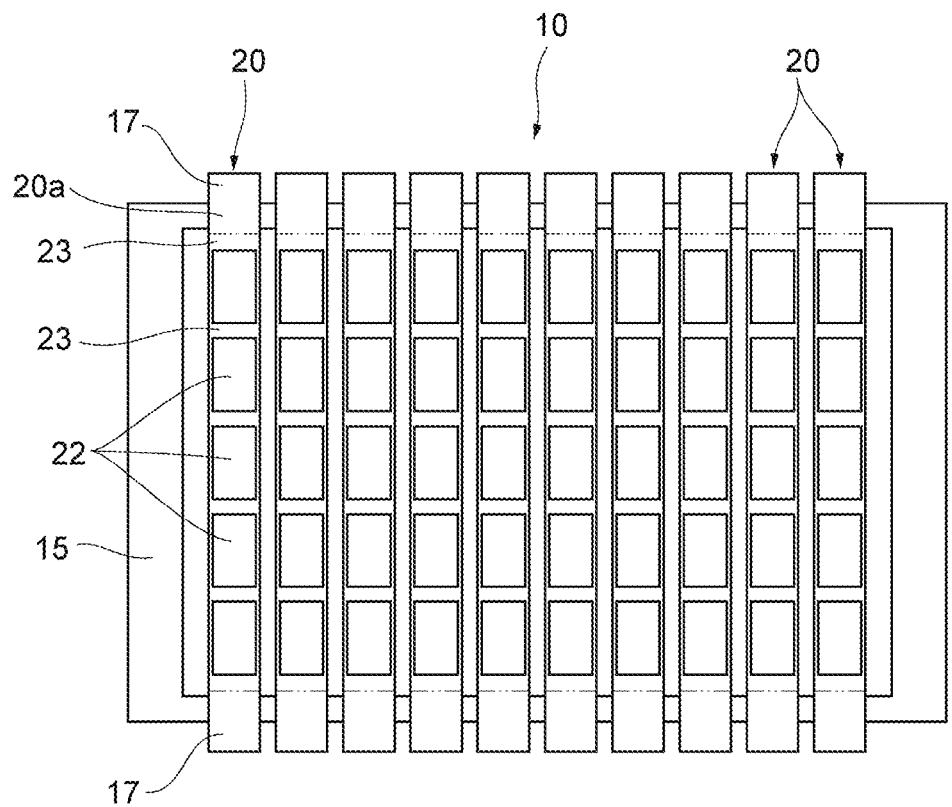
FIG. 1 is a diagram showing a metal mask device including a metal mask according to one embodiment of the present disclosure.

Hereinafter, an embodiment of the present disclosure will be described with reference to the drawings. Note that in the drawings attached to the present specification, for convenience of ease of illustration and understanding, scale ratios, longitudinal and lateral dimensional ratios, and the like are exaggerated by changing from the actual ones in some cases.

In the present specification and the present drawings, description will be given citing an example of a metal mask to be used for patterning an organic material on a substrate in a desired pattern when manufacturing an organic EL display device, and a method for manufacturing the metal mask in one embodiment of the present specification unless particularly described. However, the present disclosure is not limited to such an application, but can be applied to metal masks to be used for various applications. For example, the metal mask of the present disclosure may be used for manufacturing a device for displaying or projecting an image or video for expressing virtual reality called VR or augmented reality called AR.

In the present specification and/or the present drawings, interpretation will be made as indicated below unless particularly described.

Terms that mean a substance on which a certain component is based may not be distinguished from each other only based on different names. For example, terms such as a "substrate", a "base material", a "plate", a "sheet", and a "film" are relevant to the above description.

Terms and/or numerals that mean shapes and/or geometric conditions are not necessarily limited to their strict definitions, but may be construed to include a range to a degree that similar functions may be expected. For example, terms such as "parallel" and/or "orthogonal" are relevant to the above-described terms. Values such as "values of length" and/or "values of angle" are relevant to the above-described numerals.

In some cases where a component is expressed as being "on", "under", "on an upper side of", "on a lower side of", "above", or "below" another component, the cases may include an aspect in which the component is in direct contact with the other component, and an aspect in which a different component is included between the component and the other component. In other words, the aspect in which a different component is included between the component and the other component may be expressed as the component and the other component being indirectly connected to each other. The expression "on", "upper side", or "above" can be exchanged to the expression "under", "lower side", or "below". In other words, an up-down direction may be reversed.

Identical portions and/or portions that have a similar function are designated by identical reference characters or like reference characters, and repeated description is omitted in some cases. The ratio of dimensions in the drawings differs from an actual ratio in some cases. Illustration of some components of an embodiment is omitted in the drawings in some cases.

One or more embodiments and one or more modifications may be combined within a range where no contradiction occurs. One or more embodiments may be combined within a range where no contradiction occurs. One or more modifications may be combined within a range where no contradiction occurs.

In a case where a plurality of steps are disclosed in relation to a method such as a manufacturing method, another undisclosed step may be performed between the disclosed steps. The order of the steps is not limited within a range where no contradiction occurs.

A numeral range expressed by the word "to" includes numerals placed in front of and behind the word "to". For example, a numeral range expressed as "34 to 38 mass %" is identical to a numeral range expressed as "34 mass % or more and 38 mass % or less".

A numeral range of a numeral described in the present disclosure may be defined by combining any one of a plurality of upper-limit candidate values and any one of a plurality of lower-limit candidate values. Besides, any two of the plurality of upper-limit candidate values may be combined to define the numeral range, or any two of the plurality of lower-limit candidate values may be combined to define the numeral range without particular mention.

One embodiment of the present disclosure will be described in the following paragraphs. One embodiment of the present disclosure is an example of embodiments of the present disclosure. The present disclosure is not construed as being limited only to the one embodiment of the present disclosure.

A first aspect of the present disclosure is a metal mask including a first surface, and a second surface positioned opposite to the first surface, wherein
the first surface has through-holes, a first top part, and a second top part,
the through-holes have a first through-hole, a second through-hole, a third through-hole, a fourth through-hole, a fifth through-hole, and a sixth through-hole,
the first through-hole has a first short axis and a first long axis,
the second through-hole has a second short axis and a second long axis,
the third through-hole has a third short axis and a third long axis,
the fourth through-hole has a fourth short axis and a fourth long axis,
the fifth through-hole has a fifth short axis and a fifth long axis,
the sixth through-hole has a sixth short axis and a sixth long axis,
the first long axis is parallel to the second long axis and positioned next to the second long axis in a direction D2 crossing the first long axis,
the first short axis is parallel to the fifth short axis and positioned next to the fifth short axis in a direction D1 parallel to the first long axis,
the third long axis is parallel to the fourth long axis and positioned next to the fourth long axis in the direction D1 parallel to the first long axis,
the third short axis is parallel to the sixth short axis and positioned next to the sixth short axis in the direction D2 crossing the first long axis,
the first top part is positioned between the first long axis and the second long axis and between the third long axis and the fourth long axis,
the second top part is positioned between the first short axis and the fifth short axis and between the third short axis and the sixth short axis, and
a ratio (S2/S1) of an area S2 of a top of the second top part to an area S1 of a top of the first top part is 0.65 or less.

In a second aspect of the present disclosure, in the metal mask according to the first aspect described above,
the first top part and the second top part may alternately be present in a direction D3 passing through the first top part and the second top part.

In a third aspect of the present disclosure, in the metal mask according to the first aspect or the second aspect described above,
the direction D1 and the direction D3 may make an acute angle of 30° or more and 60° or less.

In a fourth aspect of the present disclosure, in the metal mask according to any of the first to third aspects described above,
(the area S2)$^{1/2}$ may be 1.00 times a length of the first short axis or less.

In a fifth aspect of the present disclosure, in the metal mask according to any of the first to fourth aspects described above,
the through-holes each may have a substantially rectangular or substantially elliptical opening shape.

A sixth aspect of the present disclosure is a method for manufacturing the metal mask according to any of the first to fifth aspects described above, including:
a step of preparing a metal plate including a first surface and a second surface positioned opposite to the first surface; and
an etching step of etching the metal plate to form the metal mask, wherein
the metal mask has the first surface and the second surface positioned opposite to the first surface,
the first surface has the through-holes, the first top part, and the second top part,
the through-holes have the first through-hole, the second through-hole, the third through-hole, the fourth through-hole, the fifth through-hole, and the sixth through-hole,
the first through-hole has the first short axis and the first long axis,
the second through-hole has the second short axis and the second long axis,
the third through-hole has the third short axis and the third long axis,
the fourth through-hole has the fourth short axis and the fourth long axis,
the fifth through-hole has the fifth short axis and the fifth long axis,
the sixth through-hole has the sixth short axis and the sixth long axis,
the first long axis is parallel to the second long axis and positioned next to the second long axis in the direction D2 crossing the first long axis,
the first short axis is parallel to the fifth short axis and positioned next to the fifth short axis in the direction D1 parallel to the first long axis,
the third long axis is parallel to the fourth long axis and positioned next to the fourth long axis in the direction D1 parallel to the first long axis,
the third short axis is parallel to the sixth short axis and positioned next to the sixth short axis in the direction D2 crossing the first long axis,
the first top part is positioned between the first long axis and the second long axis and between the third long axis and the fourth long axis,
the second top part is positioned between the first short axis and the fifth short axis and between the third short axis and the sixth short axis, and
the ratio (S2/S1) of the area S2 of the top of the second top part to the area S1 of the top of the first top part is 0.65 or less.

First, an example of a vapor deposition device including a metal mask will be described with reference to FIG. 1 and FIG. 2. Herein, FIG. 1 is a plan view of a metal mask device 10 including metal masks 20 according to one embodiment of the present disclosure, as seen from a first surface 20a side of the metal masks 20, and FIG. 2 is a cross-sectional view showing the vapor deposition device.

As shown in FIG. 1, each of the metal masks 20 may have a substantially rectangular shape extending in one direction. The metal mask device 10 may include the plurality of metal masks 20 made of substantially rectangular metal plates, and a frame 15 attached to the peripheries of the plurality of metal masks 20. The plurality of metal masks 20 may be aligned in a width direction orthogonal to a length direction of the metal masks 20. Each of the metal masks 20 may be fixed to the frame 15 by welding, for example, at both ends in the length direction of the metal mask 20.

The metal mask device 10 may include a member fixed to the frame 15 and partially overlapping the metal masks 20 in a thickness direction of the metal masks 20. Examples of such a member include, but not particularly limited to, a member extending in a direction crossing the length direction of the metal masks 20 and supporting the metal masks 20, a member overlapping a gap between adjacent two metal masks, and the like.

Figure 2:
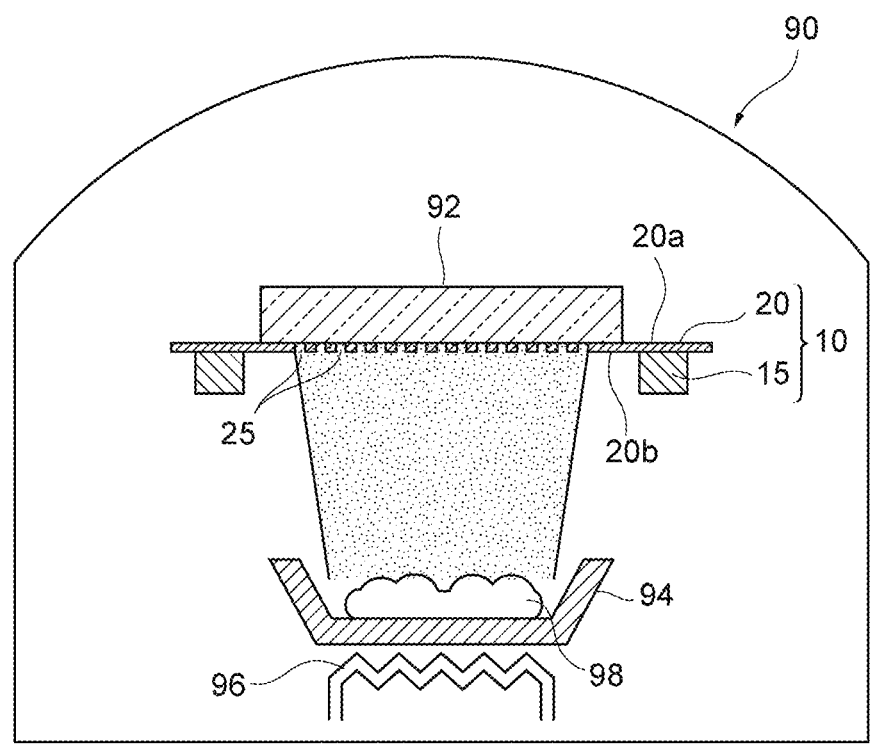
FIG. 2 is a cross-sectional view showing a vapor deposition device according to the one embodiment of the present disclosure.

This metal mask device 10 is supported in a vapor deposition device 90 so as to face a substrate 92 as shown in FIG. 2. Herein, the substrate 92 is an evaporation target such as a glass substrate. In a case where the metal mask device 10 is stored in the vapor deposition device 90 as shown in FIG. 2, a surface of the metal mask 20 facing the substrate 92 is called the first surface 20a, and a surface of the metal mask 20 positioned on a crucible 94 side that holds a vapor deposition material 98 is called a second surface 20b.

In the vapor deposition device 90, the metal mask 20 is located on a surface of the substrate 92 on the crucible 94 side. Herein, the metal mask 20 and the substrate 92 may be brought into close contact with each other by a magnetic force.

In the vapor deposition device 90, the crucible 94 that stores the vapor deposition material 98, and a heater 96 that heats the crucible 94 may be disposed below the metal mask device 10. Herein, the vapor deposition material 98 may be an organic light emitting material as an example. The vapor deposition material 98 in the crucible 94 is vaporized or sublimated by the heat from the heater 96. The vaporized or sublimated vapor deposition material 98 adheres to the substrate 92 by way of the through-holes 25 of the metal mask 20. The vapor deposition material 98 is thereby deposited on the surface of the substrate 92 in a desired pattern corresponding to the position of the through-holes 25 of the metal mask 20.

In a case of intending to vapor-deposit different types of vapor deposition materials in accordance with pixels such as RGB, the vapor deposition material 98 may be deposited on the surface of the substrate 92 using different metal masks 20 in accordance with the colors of organic light emitting materials. For example, an organic light emitting material for red, an organic light emitting material for green, and an organic light emitting material for blue may be sequentially deposited on the substrate 92. Alternatively, the metal mask 20 (the metal mask device 10) and the substrate 92 may be relatively moved little by little in an arrangement direction (the aforementioned one direction) of the through-holes 25 to sequentially deposit the organic light emitting material for red, the organic light emitting material for green, and the organic light emitting material for blue.

Figure 3:
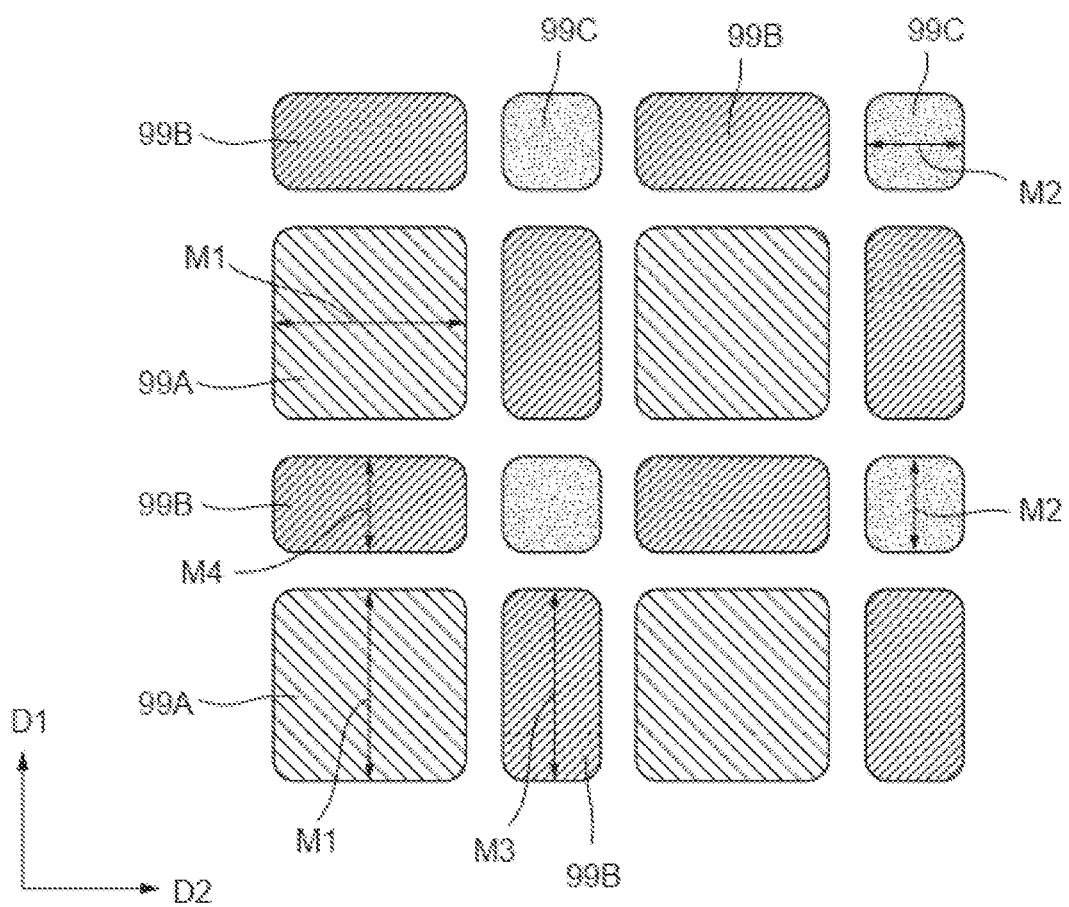
FIG. 3 is a plan view showing an example of a pattern of a vapor deposition layer of an organic EL display device.

FIG. 3 shows a plan view representing an example of a pattern of vapor deposition layers of the organic EL display device. As shown in FIG. 3, in the pattern of vapor deposition layers, a first vapor deposition layer 99A includes four sides having a dimension M1. A third vapor deposition layer 99C may include four sides having a dimension M2 smaller than the dimension M1. A second vapor deposition layer 99B may include a pair of sides having a dimension M3 and a pair of sides having a dimension M4 smaller than the dimension M3. The sides of the second vapor deposition layer 99B having the dimension M3 may be opposed to the sides of the first vapor deposition layer 99A in a first direction D1 or a second direction D2. The sides of the second vapor deposition layer 99B having the dimension M4 may be opposed to the sides of the third vapor deposition layer 99C in the first direction D1 or the second direction D2. The dimension M3 may be identical to the dimension M1. The dimension M4 may be identical to the dimension M2.

Figure 6A:
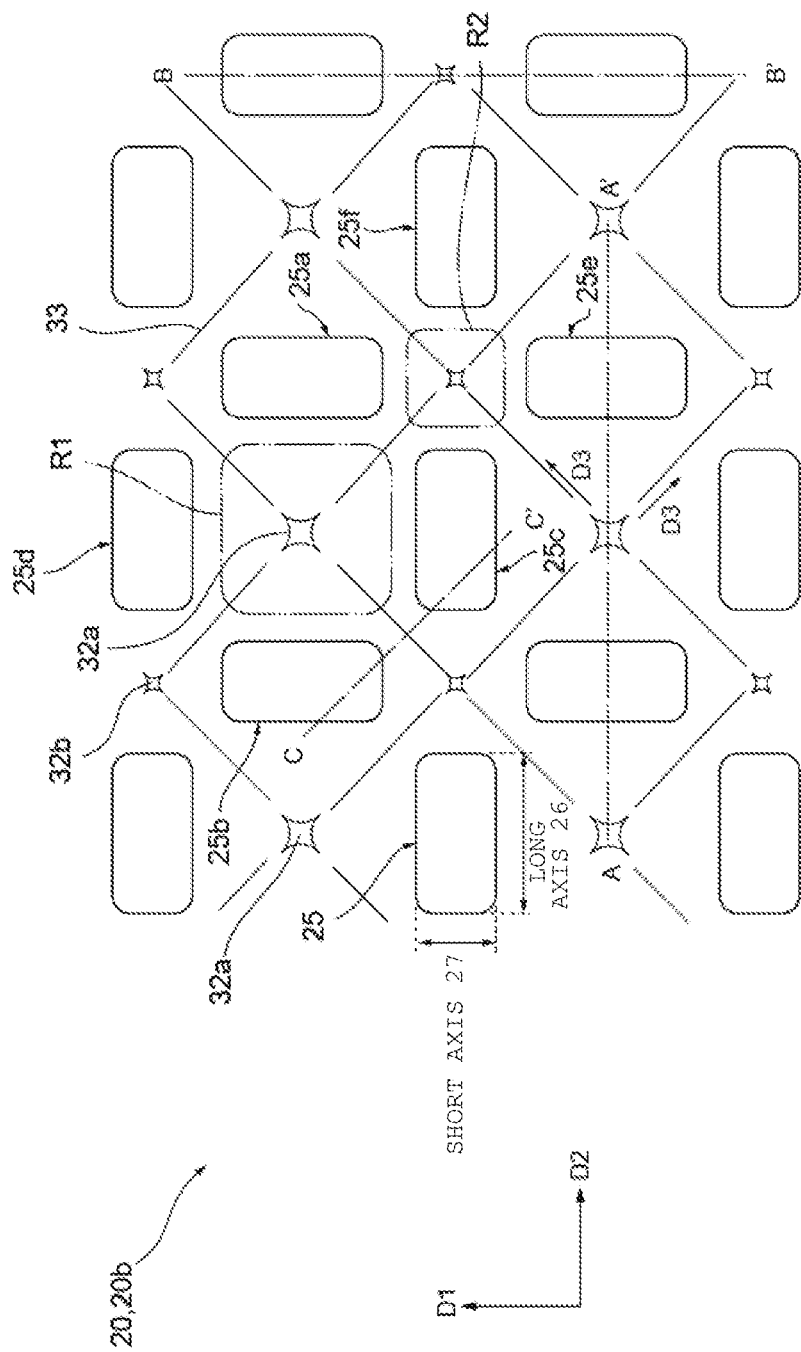
FIG. 6A is a plan view of the effective region of the metal mask according to the one embodiment of the present disclosure as seen from the second surface side.
Figure 6B:
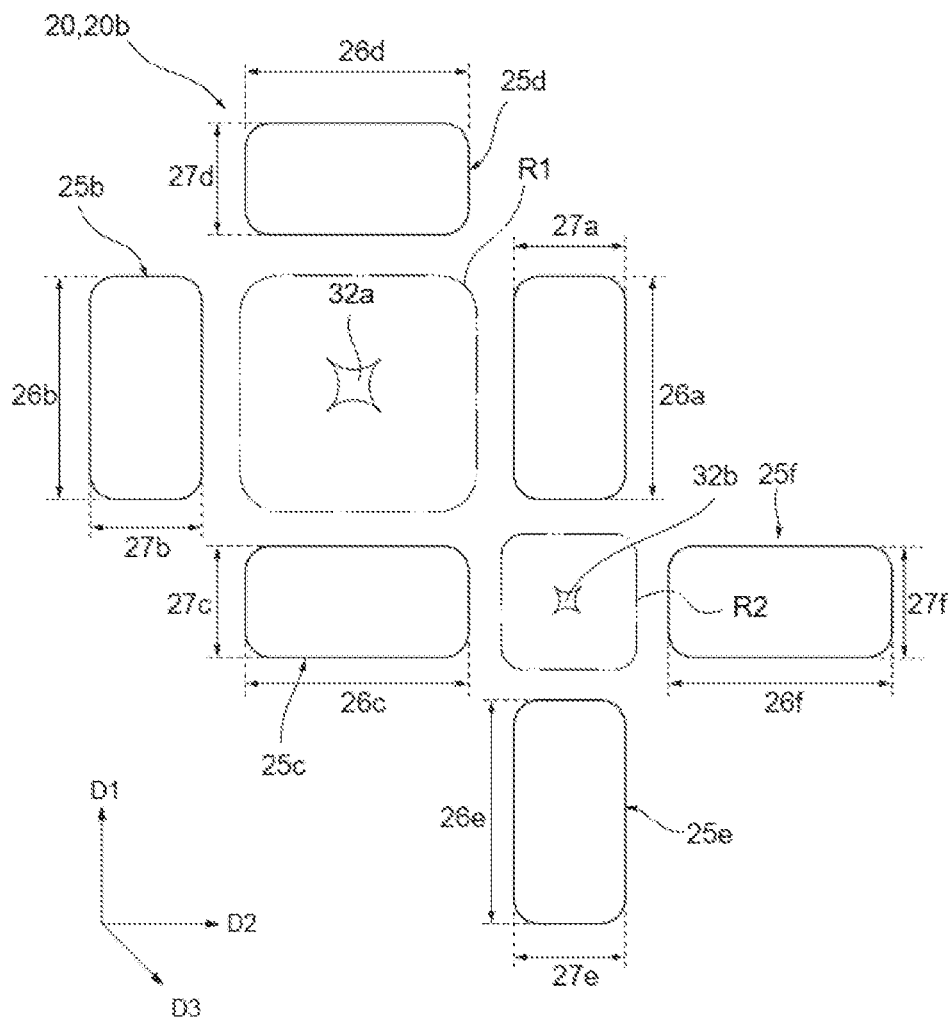
FIG. 6B is a plan view of the effective region of the metal mask according to the one embodiment of the present disclosure as seen from the second surface side.

Herein, the second vapor deposition layer 99B may be formed by using the metal mask 20 including through-holes having a long axis 26 and a short axis 27 having different lengths, as shown in FIG. 6A and FIG. 6B which will be described later. Any color of RGB, for example, may be allocated to the first vapor deposition layer 99A, the second vapor deposition layer 99B, and the third vapor deposition layer 99C.

Note that the frame 15 of the metal mask device 10 may be attached to the peripheries of the rectangular metal masks 20. The frame 15 holds the metal masks 20 in a stretched state. The metal masks 20 and the frame 15 may be fixed to each other by spot welding, for example.

FIG. 1 shows an example in which the plurality of elongated metal masks 20 are installed on the frame 15. Alternatively, a large-sized single metal mask 20 having substantially the same shape as the shape of the frame 15 may be installed on the frame 15.

Hereinafter, the metal mask of the present disclosure will be described in detail using as an example a metal mask to be used for vapor deposition of an organic light emitting material for an organic EL display device. However, the application of the metal mask of the present disclosure is not limited to vapor deposition of an organic light emitting material for an organic EL display device, but in addition, the metal mask of the present disclosure can also be used for manufacturing a device for displaying or projecting an image or video for expressing virtual reality called VR or augmented reality called AR.

The metal mask of the present disclosure is a metal mask including a first surface, and a second surface positioned opposite to the first surface, wherein
  the first surface has through-holes, a first top part, and a second top part,
  the through-holes have a first through-hole, a second through-hole, a third through-hole, a fourth through-hole, a fifth through-hole, and a sixth through-hole,
  the first through-hole has a first short axis and a first long axis,
  the second through-hole has a second short axis and a second long axis,
  the third through-hole has a third short axis and a third long axis,
  the fourth through-hole has a fourth short axis and a fourth long axis,
  the fifth through-hole has a fifth short axis and a fifth long axis,
  the sixth through-hole has a sixth short axis and a sixth long axis,
  the first long axis is parallel to the second long axis and positioned next to the second long axis in a direction D2 crossing the first long axis, the first short axis is parallel to the fifth short axis and positioned next to the fifth short axis in a direction D1 parallel to the first long axis, the third long axis is parallel to the fourth long axis and positioned next to the fourth long axis in the direction D1 parallel to the first long axis, the third short axis is parallel to the sixth short axis and positioned next to the sixth short axis in the direction D2 crossing the first long axis, the first top part is positioned between the first long axis and the second long axis and between the third long axis and the fourth long axis, the second top part is positioned between the first short axis and the fifth short axis and between the third short axis and the sixth short axis, and a ratio (S2/S1) of an area S2 of a top of the second top part to an area S1 of a top of the first top part is 0.65 or less.

Figure 4:
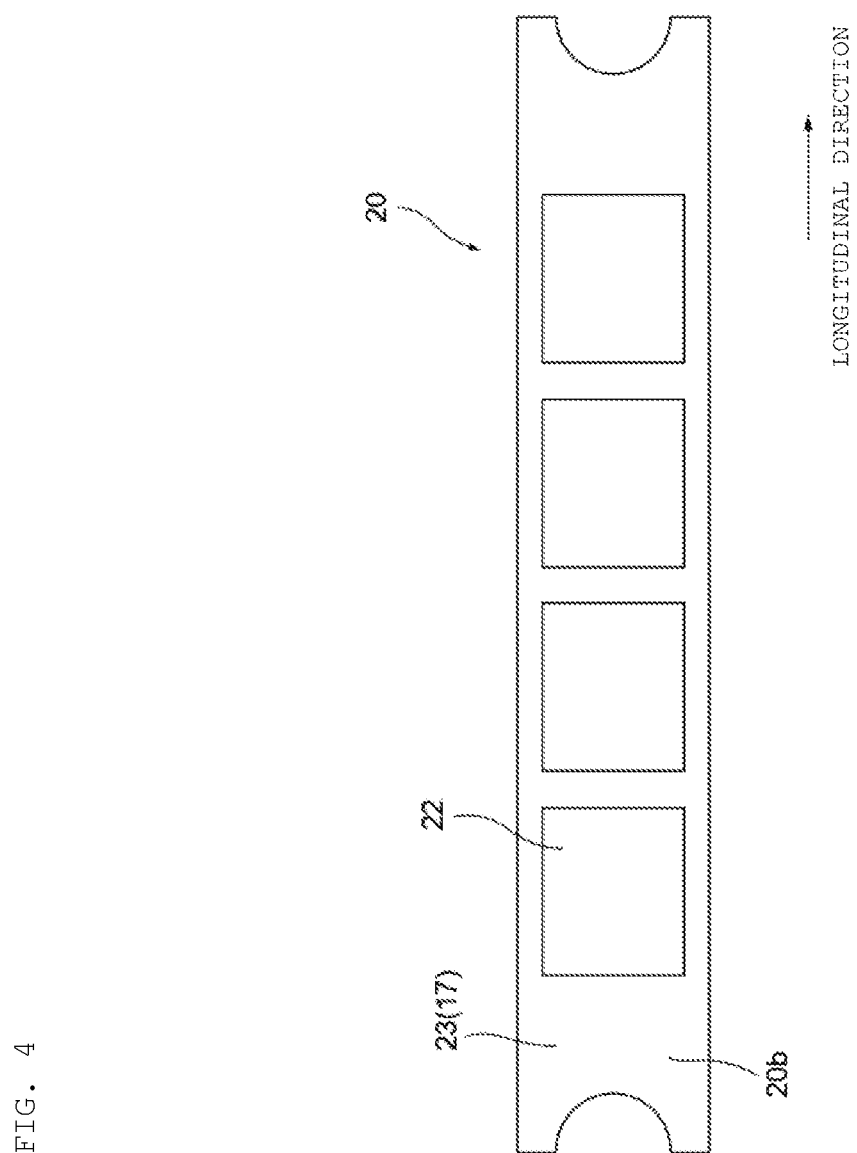
FIG. 4 is a plan view representing the metal mask according to the one embodiment of the present disclosure.

FIG. 4 shows a plan view of the metal mask 20 of one embodiment of the present disclosure. The metal mask 20 may be obtained by forming the through-holes 25 in a metal plate 51 by etching. As shown in FIG. 4, the metal mask 20 may have effective regions 22 in which the through-holes 25 are disposed, and may have a peripheral region 23 positioned around the effective regions 22. The metal mask 20 may have a substantially rectangular contour in plan view.

A height T from the first surface to the second surface preferably may be 50 μm or less, may be 40 μm or less, may be 35 μm or less, may be 30 μm or less, may be 25 μm or less, may be 20 μm or less, may be 18 μm or less, may be 15 μm or less, or may be 13 μm or less. By reducing the height T, shadow can be prevented.

In addition, the height T preferably may be 2 μm or more, may be 5 μm or more, may be 10 μm or more, or may be 15 μm or more. Increasing the height T leads to a tendency that the strength of the metal mask 20 is improved more. This can prevent the effective regions 22 from being deformed or broken, for example.

Note that the range of the height T may be determined by a combination of any one of the above-described plurality of lower-limit candidate values and any one of the above-described plurality of upper-limit candidate values. The height T is a thickness of a portion of the metal mask 20 in which the first recess 30 and the second recess 35 are not formed. In other words, the height T may be a thickness equal to the thickness of the peripheral region 23 or the thickness of the metal plate 51 of the metal mask 20.

It is preferable that the thermal expansion coefficient of the metal mask 20 should be equivalent in value to the thermal expansion coefficient of the frame 15 or the thermal expansion coefficient of the substrate 92. This can prevent occurrence of misalignment resulting from differences in dimensional change among the metal mask 20, the frame 15, and the substrate 92 during vapor deposition treatment performed under a high temperature atmosphere. Degradation in dimensional accuracy and positional accuracy of the vapor deposition material 98 adhering to the substrate 92, resulting from the misalignment, can thus be prevented.

For example, in a case where a glass substrate is used as the substrate 92, an iron alloy containing nickel may be used as a main material of the metal mask 20 and the frame 15. Examples of an iron alloy containing nickel can include an iron alloy containing 30 mass % or more and 54 mass % or less nickel. More specifically, such an iron alloy can include an invar material containing 34 mass % or more and 38 mass % or less nickel, a super-invar material further containing cobalt in addition to 30 mass % or more and 34 mass % or less nickel, a low thermal expansion Fe—Ni plating alloy containing 48 mass % or more and 54 mass % or less nickel, and the like.

Note that in a case where the temperatures of the metal mask 20, the frame 15, and the substrate 92 do not reach a high temperature in the vapor deposition treatment, it is not particularly necessary to make the thermal expansion coefficients of the metal mask 20 and the frame 15 equivalent in value to the thermal expansion coefficient of the substrate 92. In this case, an iron alloy containing chromium, such as stainless steel, nickel, a nickel-cobalt alloy, or the like can be used as the material of the metal plate 51 to be described later that constitutes the metal mask 20, besides the above-described iron alloy containing nickel.

The metal mask 20 may have the plurality of effective regions 22. For example, the metal mask 20 may have the plurality of effective regions 22 disposed in line at predetermined intervals in one direction parallel to the longitudinal direction of the metal mask 20, as shown in FIG. 4. Such a metal mask 20 is referred to as what is called a stick-like metal mask in some cases. In this case, the metal mask device 10 may have the plurality of metal masks 20 disposed in the width direction orthogonal to the longitudinal direction of the metal masks 20 and attached to the frame 15 as shown in FIG. 1.

As another example, the metal mask 20 may have a plurality of effective regions 22 disposed at predetermined intervals in one direction parallel to one side of the metal mask 20, and may have a plurality of effective regions 22 disposed at predetermined intervals in another direction orthogonal to the one direction. In other words, the metal mask 20 may have the effective regions 22 in a plurality of rows. In this case, the metal mask device 10 may have a single metal mask 20, having a size close to the size of the frame 15, attached to the frame 15.

The effective region 22 has the through-holes 25, a first top part 32a, and a second top part 32b on the first surface. The effective region 22 may be a region that faces a section on the substrate 92 where the organic light emitting material is to be vapor-deposited to form pixels and functions as a mask during vapor deposition.

The metal mask 20 may have the plurality of effective regions 22. A single effective region 22 may be configured to correspond to a display region of a single organic EL display device 100. The use of such a metal mask device 10 enables multifaceted vapor deposition of the organic EL display device. Alternatively, a single effective region 22 may be configured to correspond to a display region of a plurality of organic EL display devices.

The effective region 22 may have a substantially rectangular contour in plan view. Alternatively, the effective region 22 may have contours of various shapes such as a circular shape depending on the shape of the display region of the substrate 92.

FIG. 5A shows a perspective view of the effective region 22 as seen from the second surface 20b side as one embodiment of the present disclosure. The effective region 22 may have the through-holes 25 formed by etching. As shown in FIG. 5A, the plurality of through-holes 25 formed in each of the effective regions 22 are disposed in a predetermined pattern. For example, when seen from the second surface 20b side, the through-holes 25 may be disposed respectively at predetermined pitches in the first direction D1 and the second direction D2 crossing each other. The plurality of first top parts 32a and second top parts 32b, and a plurality of ridge lines 33 may be positioned around the through-holes 25. Adjacent ones of the second recesses 35 may be connected to each other with the ridge line 33.

As shown in FIG. 5A, the ridge line 33 refers to a boundary formed by joining of second wall surfaces 36 of adjacent ones of the second recesses 35. The height of this ridge line 33 is not constant, but may vary in a rippling manner. Note that the height of the ridge line 33 can also be regarded as the position of the ridge line 33 in the thickness direction of the metal mask 20. As a general tendency, the height of the ridge line 33 changes in accordance with the distance from the center of the through-hole 25, and rises as the distance increases.

FIG. 6A and FIG. 6B show partial plan views of the effective region 22 of the metal mask 20 as seen from the second surface 20b side. In the present disclosure, the through-holes 25 at least have a first through-hole 25a, a second through-hole 25b, a third through-hole 25c, a fourth through-hole 25d, a fifth through-hole 25e, and a sixth through-hole 25f.

Note that when it is not particularly necessary to distinguish among the first through-hole 25a, the second through-hole 25b, the third through-hole 25c, the fourth through-hole 25d, the fifth through-hole 25e, and the sixth through-hole 25f, they will simply be denoted as the "through-hole 25". Similarly, when it is not particularly necessary to distinguish among long axes of these through-holes, they will simply be denoted as a "long axis 26". Further, when it is not particularly necessary to distinguish among short axes of these through-holes, they will simply be denoted as a "short axis 27".

Figure 7:
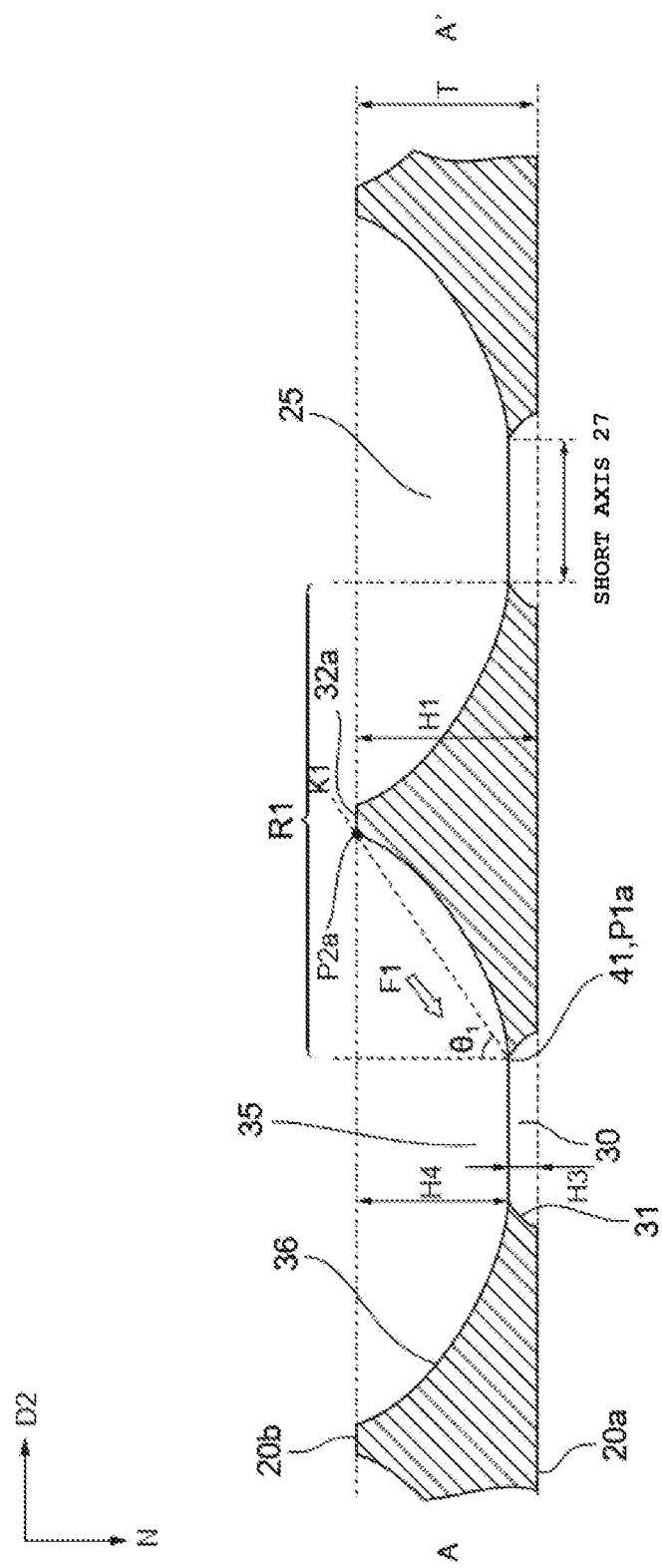
FIG. 7 is a cross-sectional view taken along the line A-A' in FIG. 6A.
Figure 8A:
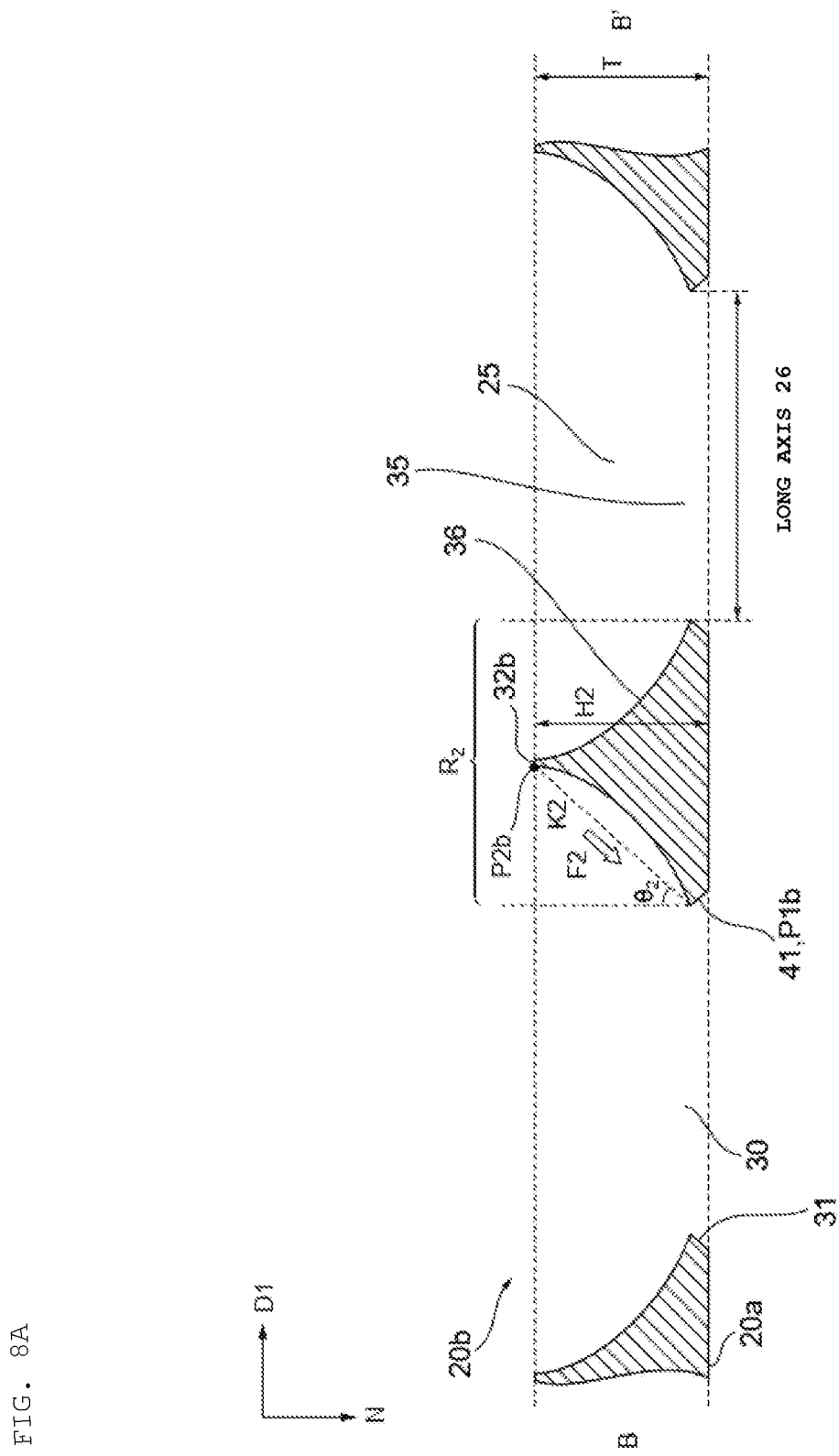
FIG. 8A is a cross-sectional view taken along the line B-B' in FIG. 6A.
Figure 8B:
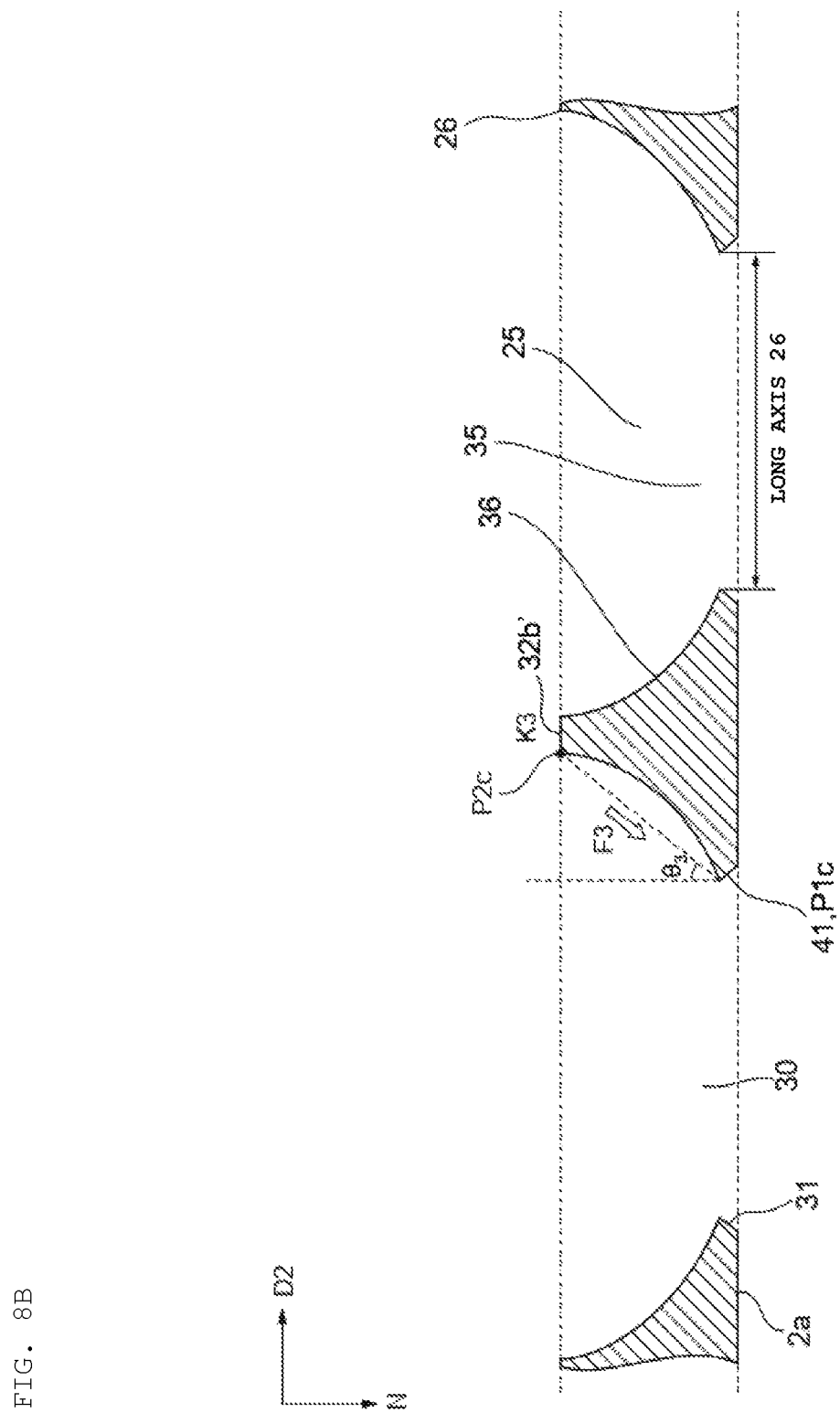
FIG. 8B is a cross-sectional view showing a modification of the example shown in FIG. 8A.

Note that the dimension of long axes 26a, 26b, and 26e of the through-holes 25a, 25b, and 25e refers to the distance between opposed connection parts 41 in the direction D1 as shown in FIG. 8A and FIG. 8B, for example. The dimension of short axes 27a, 27b, and 27e of the through-holes 25a, 25b, and 25e refers to the distance between the opposed connection parts 41 in the direction D2 as shown in FIG. 7, for example. Similarly, the dimension of long axis 26c, 26d, and 26f of the through-holes 25c, 25d, and 25f refers to the distance between the opposed connection parts 41 in the direction D2, for example. The dimension of short axes 27c, 27d, and 27f of the through-holes 25c, 25d, and 25f refers to the distance between the opposed connection parts 41 in the direction D1, for example. In other words, the long axis 26 or the short axis 27 of the through-hole 25 can be regarded as the distance in the direction D1 or D2 at a portion where the through-hole has the minimum opening area.

The first through-hole 25a has the first short axis 27a and the first long axis 26a. The first long axis 26a is parallel to the second long axis 26b and positioned next to the second long axis 26b in the direction D2 crossing the first long axis 26a. The first short axis 27a is parallel to the fifth short axis 27e and positioned next to the fifth short axis 27e in the direction D1 parallel to the first long axis 26a. The first short axis 27a is parallel to the third long axis 26c and the fourth long axis 26d, and may not be positioned next to the third long axis 26c and the fourth long axis 26d in the direction D1.

The second through-hole 25b has the second short axis 27b and the second long axis 26b. The second long axis 26b is parallel to the first long axis 26a and positioned next to the first long axis 26a in the direction D2. The second short axis 27b is parallel to the third long axis 26c and the fourth long axis 26d, and may not be positioned next to the third long axis 26c and the fourth long axis 26d in the direction D1.

The third through-hole 25c has the third short axis 27c and the third long axis 26c. The third long axis 26c is parallel to the fourth long axis 26d and positioned next to the fourth long axis 26d in the direction D1. The third short axis 27c is parallel to the sixth short axis 27f and positioned next to the sixth short axis 27f in the direction D2. The third short axis 27c is parallel to the first long axis 26a and the second long axis 26b, and may not be positioned next to the first long axis 26a and the second long axis 26b in the direction D2.

The fourth through-hole 25d has the fourth short axis 27d and the fourth long axis 26d. The fourth long axis 26d is parallel to the third long axis 26c and positioned next to the third long axis 26c in the direction D1. The fourth short axis 27d is parallel to the first long axis 26a and the second long axis 26b, and may not be positioned next to the first long axis 26a and the second long axis 26b in the direction D2.

The fifth through-hole 25e has the fifth short axis 27e and the fifth long axis 26e. The fifth short axis 27e is parallel to the first short axis 27a and positioned next to the first short axis 27a in the direction D1. The fifth short axis 27e is parallel to the fourth long axis 26d and the sixth long axis 26f, and may not be positioned next to the fourth long axis 26d and the sixth long axis 26f in the direction D1.

The sixth through-hole 25f has the sixth short axis 27f and the sixth long axis 26f. The sixth short axis 27f is parallel to the third short axis 27c and positioned next to the third short axis 27c in the direction D2. The sixth short axis 27f is parallel to the first long axis 26a and the fifth long axis 26e, and may not be positioned next to the first long axis 26a and the fifth long axis 26e in the direction D1.

As described above, the first through-hole 25a, the second through-hole 25b, and the fifth through-hole 25e have the long axes 26 parallel to the direction D1. The third through-hole 25c, the fourth through-hole 25d, and the sixth through-hole 25f have the long axes 26 parallel to the direction D2. A first region R1 surrounded by the first long axis 26a, the second long axis 26b, the third long axis 26c, and the fourth long axis 26d is thereby formed. A second region R2 surrounded by the first short axis 27a, the fifth short axis 27e, the third short axis 27c, and the sixth short axis 27f is formed.

The first top part 32a is positioned between the first long axis 26a and the second long axis 26b and between the third long axis 26c and the fourth long axis 26d. The first top part 32a is positioned substantially at the center of the first region R1. The second top part 32b is positioned between the first short axis 27a and the fifth short axis 27e and between the third short axis 27c and the sixth short axis 27f. The second top part 32b is positioned substantially at the center of the second region R2. The second region R2 surrounded by the short axis 27 is narrower than the first region R1 surrounded by the long axis 26.

In the present disclosure, the ratio (S2/S1) of the area S2 of the top of the second top part to the area S1 of the top of the first top part is 0.65 or less. The first top part 32a and the second top part 32b may each be a portion having the largest thickness in the first region R1 or the second region R2.

In FIG. 5A, the first top part 32a and the second top part 32b are expressed as portions remaining unetched and having the second surface 20b at the top. In this manner, a top part having a remaining unetched top is also referred to as a "rib bar".

A height H1 of the first top part 32a refers to the height from the first surface to the first top part 32a. A height H2 of the second top part 32b refers to the height from the first surface to the second top part 32b. In a case where the first top part 32a and the second top part 32b are rib bars, the height H1 of the first top part 32a and the height H2 of the second top part 32b become the same level as the height T.

Note that the top of the first top part 32a is flat because the second surface 20b remains unetched. The shape of the top in plan view may be a substantially rectangular shape or the like. The area S1 and the area S2 may be the area of a part of the second surface 20b remaining unetched.

If the area S2 is narrower than the area S1, the aspect of the first top part 32a and the second top part 32b is not limited to the foregoing. For example, as another aspect, the first top part 32a and the second top part 32b may neither be rib bars. As still another aspect, if the area S1 is wider than the area S2, one of the first top part 32a and the second top part 32b may not be a rib bar.

Figure 5B:
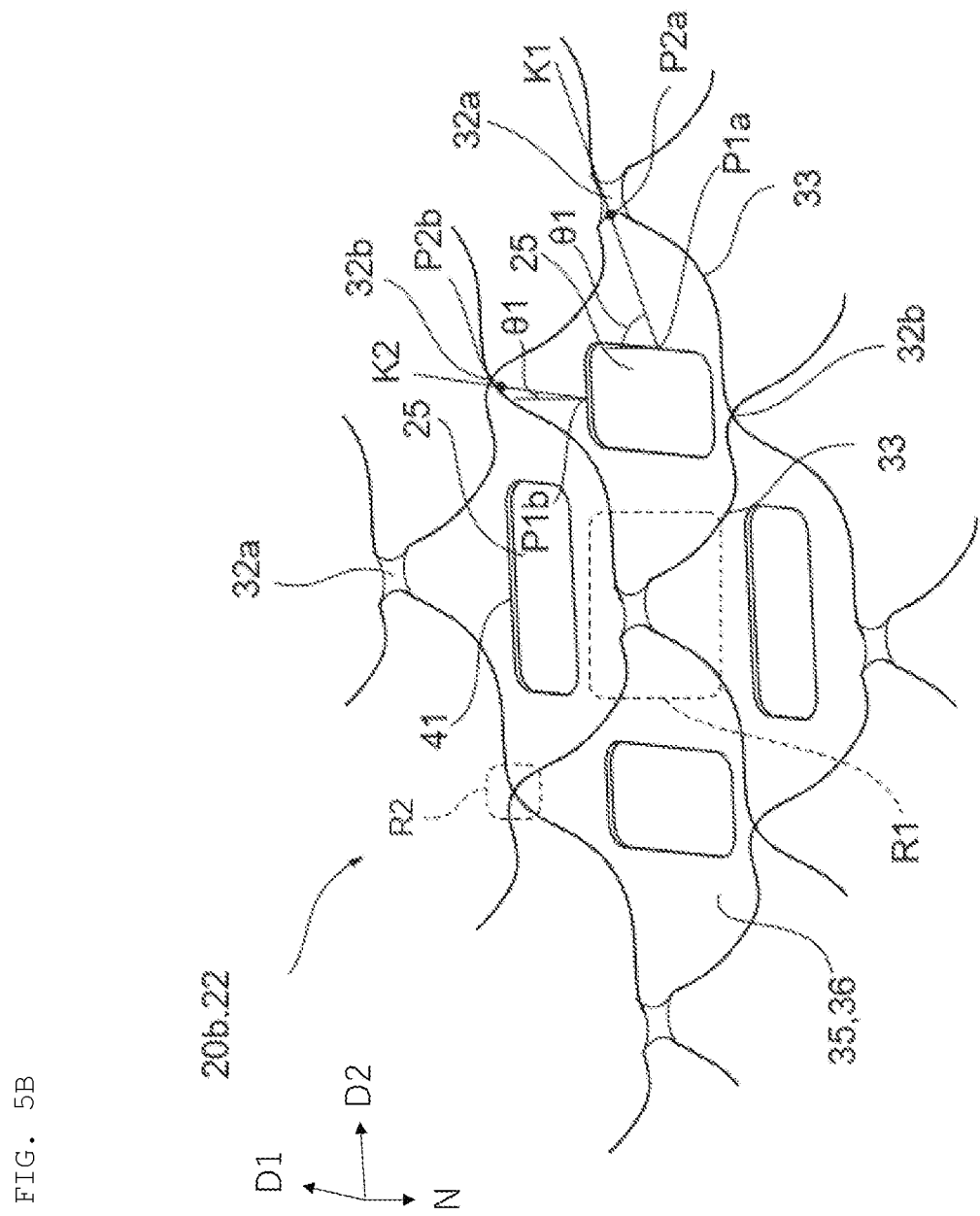
FIG. 5B is a perspective view of another aspect of the effective region of the metal mask according to the one embodiment of the present disclosure as seen from the second surface side.

FIG. 5B shows an aspect in a case where the first top part 32a is a rib bar, and the second top part 32b is not a rib bar. In FIG. 5B, the second top part 32b is a portion where the ridge line 33 formed by formed by joining of adjacent ones of the second recesses 35 has the local maximum height in the second region R2.

Figure 8C:
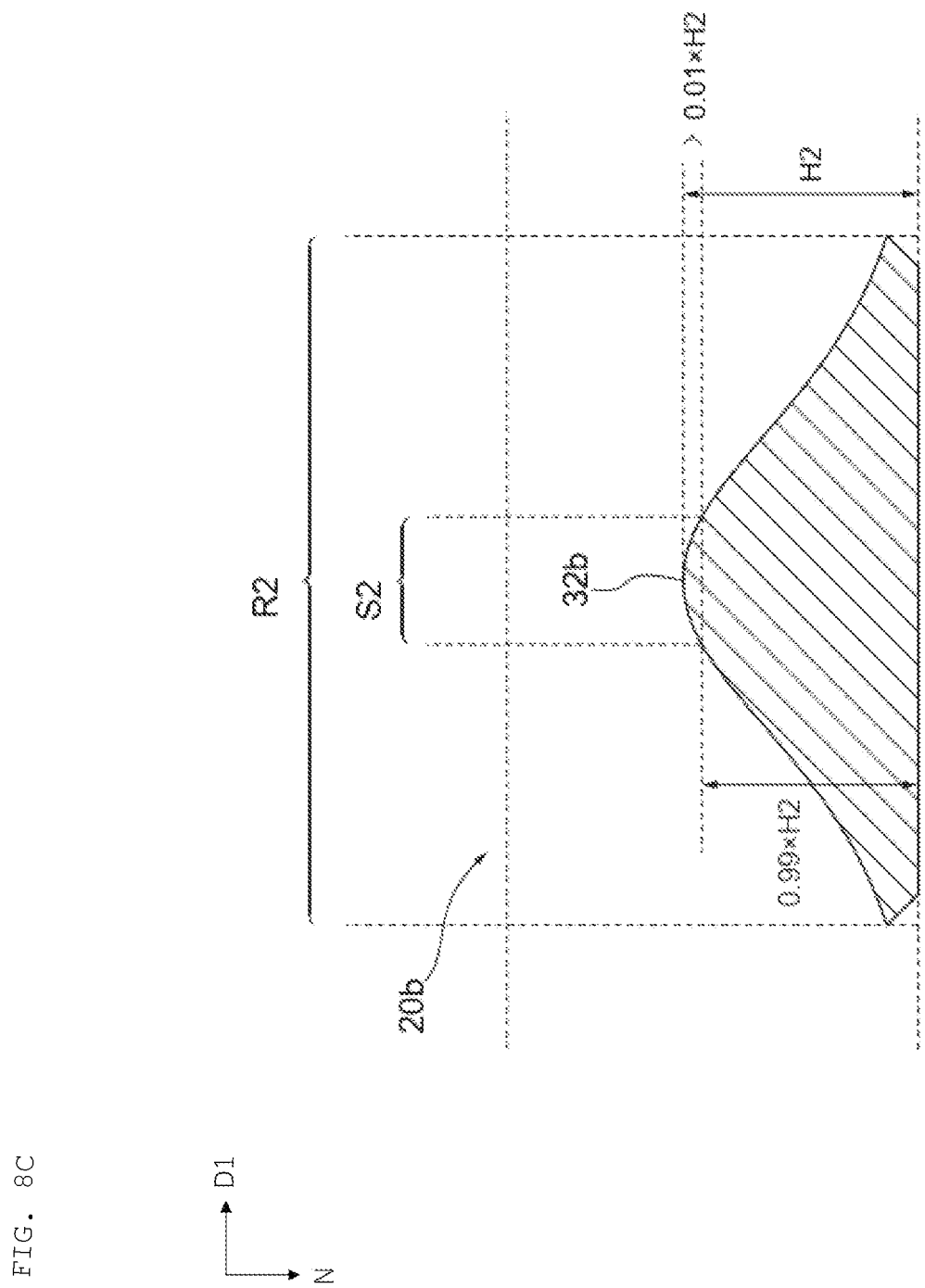
FIG. 8C is a cross-sectional view showing another modification of the example shown in FIG. 8A.

An example of how to calculate the area S2 in the case where the second top part 32b is not a rib bar is shown in FIG. 8C. As shown in FIG. 8C, the area S2 can be calculated as the area of the top of the second top part 32b in a range from the height H2 to the height H2×0.99.

Similarly, the first top part 32a may not be a rib bar. In that case, the first top part 32a is a portion where the ridge line 33 formed by joining of adjacent ones of the second recesses 35 has the local maximum height in the first region R1. How to calculate the area S1 in the case where the first top part 32a is not a rib bar is similar to how to calculate the area S2 in the case where the second top part 32b is not a rib bar. Specifically, the area S1 can be calculated as the area of the top of the first top part 32a in a range from the height H1 to the height H1×0.99.

The first top part 32a and the second top part 32b may be positioned at intersections of the plurality of ridge lines 33 extending in different directions D3. The first top part 32a and the second top part 32b may be present alternately in the directions D3 passing through the first top part 32a and the second top part 32b. The directions D3 may be directions similar to the directions in which the ridge lines between the adjacent through-holes 25 extend. This leads to the tendency that the strength can be improved and occurrence of shadow can be prevented more.

An acute angle θ3 formed by the direction D1 and the direction D3 preferably is 30° or more, more preferably is 35° or more, and still more preferably is 40° or more. In addition, the acute angle θ3 formed by the direction D1 and the direction D3 preferably is 60° or less, more preferably is 55° or less, and still more preferably is 50° or less. This leads to the tendency that the strength is improved more and occurrence of shadow is prevented more.

Setting the angle θ3 to fall within the above-described range leads to the tendency that the strength is improved more and occurrence of shadow is prevented more. Note that the range of the angle θ3 may be determined by a combination of any one of the above-described plurality of lower-limit candidate values and any one of the above-described plurality of upper-limit candidate values.

The area S1 of the top of the first top part 32a preferably may be 35 μm² or more, may be 40 μm² or more, may be 45 μm² or more, may be 50 μm² or more, or may be 55 μm² or more. In addition, the area S1 of the top of the first top part 32a preferably may be 400 μm² or less, may be 350 μm² or less, may be 300 μm² or less, may be 250 μm² or less, or may be 200 μm² or less.

Reducing the area S1 of the top of the first top part 32a leads to the tendency that shadow is prevented more. Increasing the area S1 of the top of the first top part 32a leads to the tendency that the strength of the metal mask 20 is improved more. Note that the range of the height H1 of the first top part 32a may be determined by a combination of any one of the above-described plurality of lower-limit candidate values and any one of the above-described plurality of upper-limit candidate values.

The height H1 of the first top part 32a preferably may be 50 μm or less, 45 μm or less, 40 μm or less, 35 μm or less, 30 μm or less, 25 μm or less, 20 μm or less, 18 μm or less, 15 μm or less, or 13 μm or less. In addition, the height H1 of the first top part 32a preferably may be 2 μm or more, 5 μm or more, 10 μm or more, or 15 μm or more.

In the case where the first top part 32a is not shaped as a rib bar, but is a portion where the ridge recesses 35 has the local maximum height in the first region R1, the height H1 of the first top part 32a preferably may be 0.65 times the height T or more, may be 0.70 times or more, may be 0.75 times or more, may be 0.80 times or more, or may be 0.85 times or more. In addition, the height H1 of the first top part 32a preferably may be 1.00 times the height T or less, may be 0.95 times or less, may be 0.90 times or less, may be 0.85 times or less, or may be 0.80 times or less.

Reducing the height H1 of the first top part 32a leads to the tendency that shadow is prevented more. Increasing the height H1 of the first top part 32a leads to the tendency that the strength of the metal mask 20 is improved more. Note that the range of the height H1 of the first top part 32a may be determined by a combination of any one of the above-described plurality of lower-limit candidate values and any one of the above-described plurality of upper-limit candidate values.

The area S2 of the top of the second top part 32b preferably may be 0 μm² or more, may be 2.5 μm² or more, may be 5.0 μm² or more, may be 7.5 μm² or more, or may be 10 μm² or more. In addition, the area S2 of the top of the second top part 32b preferably may be 100 μm² or less, may be 75 μm² or less, may be 50 μm² or less, may be 40 μm² or less, or may be 30 μm² or less.

The ratio (S2/S1) of the area S2 to the area S1 is 0.65 or less, preferably may be 0.60 or less, may be 0.55 or less, may be 0.50 or less, may be 0.45 or less, may be 0.40 or less, may be 0.35 or less, or may be 0.30 or less. In addition, the ratio (S2/S1) of the area S2 to the area S1 preferably may be 0 or more, may be 0.01 or more, may be 0.03 or more, may be 0.05 or more, may be 0.07 or more, or may be 0.10 or more. The range of the ratio (S2/S1) may be any combination of the above-described upper limit values and lower limit values, and may be 0.01 or more and 0.65 or less, may be 0.03 or more and 0.60 or less, may be 0.05 or more and 0.55 or less, may be 0.07 or more and 0.50 or less, or may be 0.10 or more and 0.45 or less, for example. Setting the ratio (S2/S1) of the area S2 to the area S1 at 0.65 or less leads to the tendency that shadow is prevented more. Setting the ratio (S2/S1) of the area S2 to the area S1 at 0.01 or more leads to the tendency that the strength is improved more.

The length of one side, (the area $S2)^{1/2}$, in a case of assuming the second top part 32b as a square preferably may be 0.010 times the length of the first short axis 27a or more, may be 0.025 times or more, may be 0.050 times or more, may be 0.075 times or more, or may be 0.100 times or more. In addition, (the area $S2)^{1/2}$ preferably may be 1.00 times the length of the first short axis 27a or less, may be 0.500 times or less, may be 0.250 times or less, may be 0.200 times or less, or may be 0.175 times or less.

Reducing the area S2 of the top of the second top part 32*b* leads to the tendency that shadow is prevented more. Increasing the area S2 of the top of the second top part 32*b* leads to the tendency that the strength of the metal mask 20 is improved more. Note that the range of the area S2 of the top of the second top part 32*b* may be determined by a combination of any one of the above-described plurality of lower-limit candidate values and any one of the above-described plurality of upper-limit candidate values.

The height H2 of the second top part 32*b* preferably may be 50 μm or less, may be 45 μm or less, may be 40 μm or less, may be 35 μm or less, may be 30 μm or less, may be 25 μm or less, may be 20 μm or less, may be 18 μm or less, may be 15 μm or less, or may be 13 μm or less. In addition, the height H2 of the second top part 32*b* preferably may be 2 μm or more, may be 5 μm or more, may be 10 μm or more, or may be 15 μm or more.

In the case where the second top part 32*b* is not shaped as a rib bar, but is a portion where the ridge recesses 35 has the local maximum height in the second region R2, the height H2 of the second top part 32*b* preferably may be 0.65 times the height T or more, may be 0.70 times or more, may be 0.75 times or more, may be 0.80 times or more, or may be 0.85 times or more. In addition, the height H2 of the second top part 32*b* preferably may be 1.00 times the height T or less, may be 0.95 times or less, may be 0.90 times or less, may be 0.85 times or less, or may be 0.80 times or less.

Further, the height H2 of the second top part 32*b* preferably may be 0.50 times the height H1 of the first top part 32*a* or more, may be 0.55 times or more, may be 0.60 times or more, may be 0.65 times or more, or may be 0.70 times or more. The height H2 of the second top part 32*b* preferably may be 1.00 times the height H1 of the first top part 32*a* or less, may be 0.95 times or less, may be 0.90 times or less, may be 0.85 times or less, or may be 0.80 times or less.

Reducing the height H2 of the second top part 32*b* leads to the tendency that shadow is prevented more. Increasing the height H2 of the second top part 32*b* leads to the tendency that the strength of the metal mask 20 is improved more. Note that the range of the height H2 of the second top part 32*b* may be determined by a combination of any one of the above-described plurality of lower-limit candidate values and any one of the above-described plurality of upper-limit candidate values.

The peripheral region 23 is the region positioned around the effective regions 22, and may be positioned to surround the effective regions 22. The peripheral region 23 is not the region having the through-holes 25 for passage of the vapor deposition material, but is the region positioned around the effective regions 22 to support the effective regions 22. However, a through-hole not intended for passage of the vapor deposition material and a recess formed by half-etching or the like may be formed in the peripheral region 23 for various purposes.

The peripheral region may have an end 17 of the metal mask fixed to the frame. As shown in FIG. 1, in the case of the metal mask 20 shaped as an elongated stick, the ends 17 may be positioned at both ends in the length direction. The end 17 may have a U-shaped notch. On the other hand, in the case where the metal mask is a large-sized mask having substantially the same shape as the frame, the end 17 may be positioned on the periphery of the metal mask. The end 17 may be partially cut after the metal mask is fixed to the frame.

In one embodiment of the present disclosure, the end 17 may be formed integrally with the other peripheral region 23 as shown in FIG. 4, or may be formed by a member separate from the other peripheral region. In this case, the end 17 may be bonded to another portion of the peripheral region by welding, for example.

An example of the through-holes 25 that the effective region 22 has will be described in further detail mainly with reference to FIG. 6A to FIG. 9. FIG. 6A is a partial plan view of the effective region 22 of the metal mask 20 as seen from the second surface 20*b* side.

Figure 9:
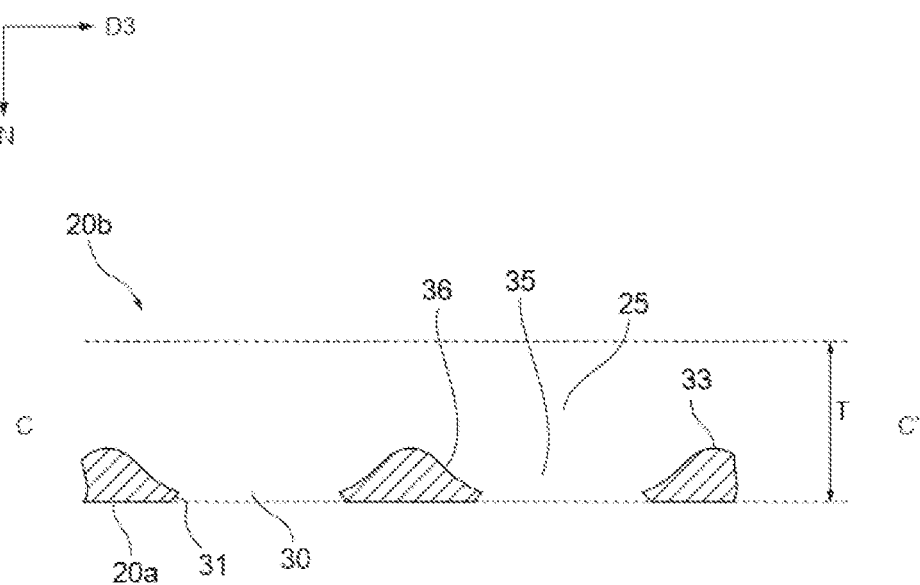
FIG. 9 is a cross-sectional view taken along the line C-C' in FIG. 6A.

FIG. 7 is a cross-sectional view taken along the line A-A' in FIG. 6A, FIG. 8A is a cross-sectional view taken along the line B-B' in FIG. 6A, and FIG. 9 is a cross-sectional view taken along the line C-C' in FIG. 6A. Specifically, FIG. 7 is a cross-sectional view in a case where the effective region 22 of the metal mask 20 is cut in a direction alternately passing through the through-hole 25 and the first top part 32*a*, in other words, the same direction as the short axis 27. FIG. 8A is a cross-sectional view in a case where the effective region 22 of the metal mask 20 is cut in a direction alternately passing through the through-hole 25 and the second top part 32*b*, in other words, the same direction as the long axis 26. FIG. 9 is a cross-sectional view in a case where the effective region 22 of the metal mask 20 is cut along the ridge line 33 between the through-holes 25.

As shown in FIG. 6A, at least some of the plurality of through-holes 25 are disposed respectively at predetermined pitches in the first direction D1 and the second direction D2 crossing each other. In the example shown in FIG. 6A, the first direction D1 and the second direction D2 may be orthogonal to each other. The first direction D1 and the second direction D2 may each coincide with the length direction or the width direction of the metal mask 20, or may be inclined with respect to the length direction or the width direction of the metal mask 20. For example, the first direction D1 may be inclined at 45 degrees with respect to the length direction of the metal mask 20.

The pitches of the through-holes 25 in the effective region 22 are not particularly limited. For example, in a case where the metal mask 20 (the metal mask device 10) is used for fabricating a display (approximately 2 inch or more and 5 inch or less) of a mobile phone, a digital camera, or the like, the pitches of the through-holes 25 may be set at approximately 28 μm or more and 254 μm or less.

Although the orientation of the through-holes 25 disposed in each of the first direction D1 or the second direction D2 is not particularly limited, the through-holes 25 may be disposed such that the first direction D1 or the second direction D2 and the direction of the long axes 26 of the through-holes 25 are parallel to each other as shown in FIG. 6A, for example. Alternatively, the through-holes 25 may be disposed instead such that the first direction D1 or the second direction D2 and the direction of the short axes 27 of the through-holes 25 are parallel to each other.

The through-hole 25 is not particularly restricted if its opening shape has the short axis 27 and the long axis 26. The opening shape may be a substantially rectangular shape or a substantially elliptical shape, or may be a polygonal shape such as hexagon or octagon extending in one direction. The ratio (short axis/long axis) of the short axis 27 to the long axis 26 preferably may be 0.30 or more, may be 0.40 or more, may be 0.50 or more, may be 0.60 or more, may be 0.70 or more, may be 0.80 or more, or may be 0.90 or more. In addition, the ratio (short axis/long axis) of the short axis 27 to the long axis 26 preferably may be 0.90 or less, may be 0.80 or less, may be 0.70 or less, may be 0.60 or less, may be 0.50 or less, or may be 0.40 or less.

Note that the range of the ratio (short axis/long axis) may be determined by a combination of any one of the above-described plurality of lower-limit candidate values and any one of the above-described plurality of upper-limit candidate values. The short axis 27 and the long axis 26 may be orthogonal to each other. For example, in the case where the through-holes 25 has a substantially rectangular shape or a substantially elliptical shape, the short axis 27 and the long axis 26 can be orthogonal to each other.

As shown in FIG. 6A to FIG. 9, the plurality of through-holes 25 extend through the metal mask 20 in the thickness direction. The through-hole 25 may be formed by communication of the first recess 30 formed by etching on a first surface 51$a$ side of the metal plate 51 and the second recess 35 formed by etching on a second surface 51$b$ side of the metal plate 51. Note that the first surface 51$a$ of the metal plate 51 corresponds to the first surface 20$a$ of the metal mask 20.

Etching of the metal plate 51 progresses isotropically in various directions from holes in a resist pattern. Thus, the first recess 30 and the second recess 35 have shapes such that their cross sectional areas at respective positions in the thickness direction of the metal mask 20 gradually decrease with progress in the thickness direction from the surface.

In the through-hole 25 formed by communication of the first recess 30 and the second recess 35 in this manner, a first wall surface 31 of the first recess 30 and a second wall surface 36 of the second recess 35 are connected to each other via the circular connection part 41. At the connection part 41, the direction in which the wall surface of the through-hole 25 spreads changes. For example, the direction in which the wall surface spreads discontinuously changes at the connection part 41. In one embodiment of the present disclosure, the opening area of the through-hole 25 in plan view is minimized at the connection part 41. Note that although not shown in the drawings, the opening area of the through-hole 25 may be minimized at a position in the thickness direction of the metal mask 20 other than the connection part 41.

At the second surface 20$b$ side of the effective region 22, the second recesses 35 of adjacent two of the through-holes 25 may be connected to each other by the ridge line 33. In other words, the second surface 51$b$ of the metal plate 51 constituting the metal mask 20 may not be left between the adjacent two second recesses 35. Such a through-hole 25 may be formed by etching the metal plate 51 such that the second surface 51$b$ of the metal plate 51 is not left between the adjacent two second recesses 35 as in a manufacturing method which will be described later. Note that the second surface 51$b$ of the metal plate 51 corresponds to the second surface 20$b$ of the metal mask 20.

In a vapor deposition step through use of the metal mask 20, the vapor deposition material 98 passes through the second recess 35, the opening area of which gradually decreases, and adheres to the substrate 92. A part of the vapor deposition material 98 moves in a thickness direction N of the substrate 92 from the crucible 94 toward the substrate 92, while another part of the vapor deposition material 98 may move in a direction inclined with respect to the thickness direction N of the substrate 92 as indicated by a direction F1 from the second surface 20$b$ side toward the first surface 20$a$ side in FIG. 7, or as indicated by a direction F2 from the second surface 20$b$ side toward the first surface 20$a$ side in FIG. 8A.

In this manner, the part of the vapor deposition material 98 moving in the inclined direction F1 or F2 reaches and adheres to the second wall surface 36 of the second recess 35 before passing through the through-hole 25 and reaching the substrate 92, which may cause shadow. As the proportion of the vapor deposition material 98 that adheres to the second wall surface 36 of the second recess 35 in this manner is higher, the utilization efficiency of the vapor deposition material 98 in the vapor deposition step degrades.

In this respect, a case where the through-hole has an anisotropic shape such as the shape having the short axis 27 and the long axis 26 will be studied more specifically. As shown in FIG. 6A, in the case where the through-hole has an anisotropic shape such as the shape having the short axis 27 and the long axis 26, the first region R1 which is relatively wide and the second region R2 which is relatively narrow may be present.

The through-hole 25 may have the first recess 30 on the first surface 20$a$ side as well as the second recess 35, the connection part 41, a first angle $\theta 1$, and a second angle $\theta 2$ on the second surface 20$b$ side. Herein, the connection part 41 is a ridge part where the first recess 30 and the second recess 35 are connected to each other. At the connection part 41, the direction in which the wall surface of the through-hole 25 spreads changes discontinuously. In one embodiment of the present disclosure, the opening area of the through-hole 25 in plan view may be minimized at the connection part 41. Alternatively, the opening area of the through-hole 25 may be minimized at a position in the thickness direction of the metal mask 20 other than the connection part 41.

The first angle $\theta 1$ is an angle made by a straight line K1 with respect to the thickness direction N of the metal mask. Herein, the straight line K1 is a straight line passing through a portion P1a of the connection part 41 closest to the first top part 32$a$ and a portion P2a of the first top part 32$a$ closest to the connection part 41.

The second angle $\theta 2$ is an angle made by a straight line K2 with respect to the thickness direction N of the metal mask. Herein, the straight line K2 is a straight line passing through a portion P1b of the connection part 41 closest to the second top part 32$b$ and a portion P2b of the second top part 32$b$ closest to the connection part 41.

Herein, suppose that there are rib bars remaining unetched both in the first region R1 and the second region R2. In this case, when seen in a plane obtained by cutting the effective region 22 of the metal mask 20 in the same direction as the short axis 27 as shown in FIG. 7, the angle $\theta 1$ of the direction F1 connecting the first top part 32$a$ and the connection part 41 is relatively gentle. On the other hand, however, FIG. 8B shows a case where a second top part 32$b'$ has an area of the top on the same level as the first top part 32$a$. In this case, when seen in a plane obtained by cutting the effective region 22 of the metal mask 20 in the same direction as the long axis 26, an angle $\theta 3$ of a direction F3 connecting the second top part 32$b'$ and the connection part 41 is a relatively steep angle.

In other words, suppose that there are rib bars both in the first region R1 and the second region R2 in the case where the through-hole 25 has an anisotropic shape such as the shape having the short axis 27 and the long axis 26. In this case, shadow is less likely to occur because the distance from the through-hole to the first top part is relatively long even if the area of the top of the first top part positioned in the short axis direction D2 of the through-hole 25 is wide. On the other hand, as for the second top part positioned in the long axis direction D1 of the through-hole 25, the distance from the through-hole to the second top part is relatively short. Thus, shadow is likely to occur when the area of the top of second top part is wide.

In contrast, in one embodiment of the present disclosure, the area S2 of the top of the second top part 32$b$ is made narrower than the area S1 of the top of the first top part 32*a*, as shown in FIG. 6A. This enables the angle θ2 of the direction F2 connecting the connection part 41 and the second top part 32*b* to be much gentler with respect to the thickness direction N of the metal mask 20. By narrowing the area of the top of the second top part 32*b* which is likely to cause shadow in this manner, shadow is less likely to occur. On the other hand, by widening the area of the top of the first top part 32*a* which is less likely to cause shadow, a thick portion can be made wider, and improvement of the strength of the metal mask can be achieved.

In this manner, by having the second top part formed by etching in the second region R2 surrounded by the short axes 27, the angle θ2 of the direction F2 can be made much closer to the angle θ1 of the direction F1. This can make it less likely to cause a difference in how shadow occurs between the directions of the short axis 27 and the long axis 26.

Although FIG. 7 and FIG. 8A show the cross-sectional views in the case where it is supposed that there are rib bars remaining unetched as the first top part 32*a* and the second top part 32*b* both in the first region R1 and the second region R2, the present disclosure is not limited to this. For example, as shown in FIG. 8C as an example, the second top part 32*b* may be a portion where the ridge recesses 35 has the local maximum height in the second region R2, rather than being shaped as a rib bar. Alternatively, similarly to FIG. 8C, the first top part 32*a* may also be a portion where the ridge line 33 formed by joining of adjacent ones of the second recesses 35 has the local maximum height in the first region R1, rather than being shaped as a rib bar.

In these cases, the first top part 32*a* and the second top part 32*b* do not each have a part of the second surface 20*b* remaining unetched at the top. The area S1 or the area S2 of the top on that occasion can be calculated as a range of the top of the first top part 32*a* or the second top part 32*b*, included in a range from the highest apex of the first top part 32*a* or the second top part 32*b* to a depth of 0.01 times the height H1 or H2 (FIG. 8C).

The angle θ1 preferably may be 25° or more, may be 30° or more, or may be 35° or more. In addition, the angle θ1 preferably may be 70° or less, may be 65° or less, may be 60° or less, or may be 55° or less.

The angle θ2 preferably may be 25° or more, may be 30° or more, or may be 35° or more. In addition, the angle θ2 preferably may be 70° or less, may be 65° or less, may be 60° or less, or may be 55° or less.

Setting the angle θ1 and the angle θ2 as described above leads to a tendency that the difference in how shadow occurs between the directions of the short axis 27 and the long axis 26 decreases. Note that the above-described numeral ranges in relation to the angle θ1 and the angle θ2 may be determined by a combination of any one of the above-described plurality of lower-limit candidate values and any one of the above-described plurality of upper-limit candidate values.

Note that the first recess 30 and the second recess 35 may herein be distinguished from each other by their depths. For example, as shown in FIG. 7, the through-hole 25 may have the first recess 30 having a height H3 and the second recess 35*a* having a height H4. Herein, the height H3 is the height from the first surface 20*a* to the connection part 41. The height H4 is the height from the second surface 20*b* to the connection part 41. At this time, it is preferable that the height H3 should be lower than the height H4. The surface having the first recess 30 in such a depth relationship may be the first surface 20*a*, and the surface having the second recess 35 may be the second surface 20*b*.

Increasing the ratio (H4/H3) as described above leads to a tendency that the utilization efficiency and vapor deposition accuracy of the vapor deposition substance are improved more. Reducing the ratio (H4/H3) leads to a tendency that the effective region 22 can be prevented from being deformed or broken. Note that the range of the ratio (H4/H3) may be determined by a combination of any one of the above-described plurality of lower-limit candidate values and any one of the above-described plurality of upper-limit candidate values.

The depth relationship between the first recess 30 and the second recess 35 may be replaced by opening dimensions of the first recess 30 and the second recess 35. For example, the opening dimension of the first recess 30 may be smaller than the opening dimension of the second recess 35.

A method for manufacturing a metal mask according to one embodiment of the present disclosure includes a step of preparing the metal plate 51 having the first surface 20*a* and the second surface 51*b* positioned opposite to the first surface 51*a*, and an etching step of etching the metal plate 51 to form the metal mask 20.

Figure 10:
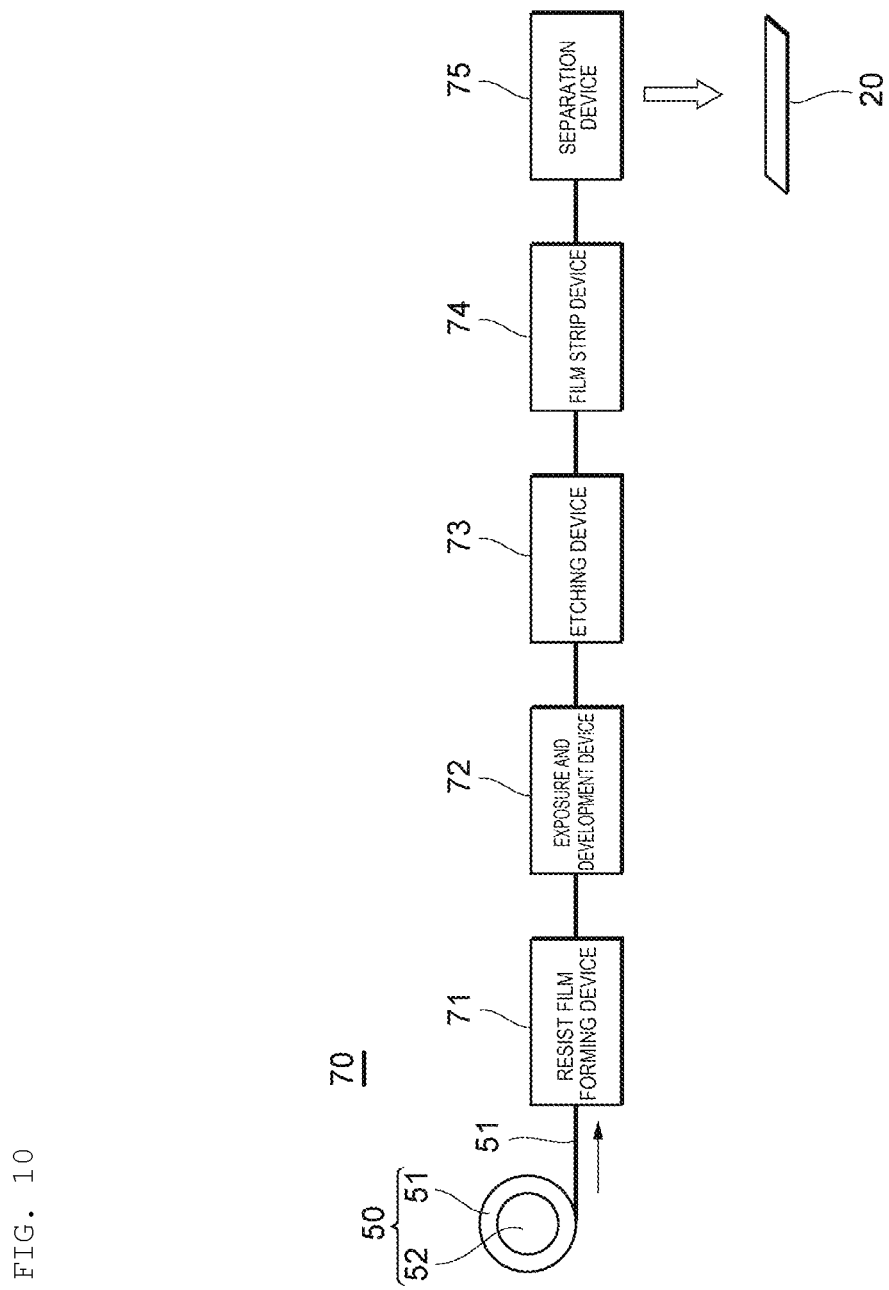
FIG. 10 is a schematic view for describing an example of a method for manufacturing a metal mask.

The method for manufacturing the metal mask 20 according to one embodiment of the present disclosure will be described mainly with reference to FIG. 10 to FIG. 15. FIG. 10 is a diagram showing a manufacturing apparatus 70 for manufacturing the metal mask 20 using the metal plate 51. First, a rolled-up body 50 including the metal plate 51 rolled up around a shaft member 52 is prepared. Subsequently, the metal plate 51 in the rolled-up body 50 is pulled out from the shaft member 52, and the metal plate 51 is sequentially transferred to a resist film forming device 71, an exposure and development device 72, an etching device 73, a film strip device 74, and a separation device 75 shown in FIG. 10. In the process, the through-holes 25 are formed in the metal plate 51, and further by cutting an elongated metal plate, the metal mask 20 formed of a sheet-like metal plate can be obtained.

Note that although FIG. 10 shows an example in which the metal plate 51 is transferred in its length direction to thereby move from device to device, the present disclosure is not limited to this. For example, the metal plate 51 provided with a resist film in the resist film forming device 71 may be rolled up again around the shaft member 52, and then the metal plate 51 in the state of the rolled-up body may be supplied to the exposure and development device 72. Alternatively, the metal plate 51 in a state provided with a resist film having subjected to exposure and development treatment in the exposure and development device 72 may be rolled up again around the shaft member 52, and then the metal plate 51 in the state of the rolled-up body may be supplied to the etching device 73. Alternatively, the metal plate 51 etched in the etching device 73 may be rolled up again around the shaft member 52, and then the metal plate 51 in the state of the rolled-up body may be supplied to the film strip device 74. Alternatively, the metal plate 51 from which a resin 54 which will be described later and the like have been removed in the film strip device 74 may be rolled up again around the shaft member 52, and then the metal plate 51 in the state of the rolled-up body may be supplied to the separation device 75.

The resist film forming device 71 forms a resist film on the surface of the metal plate 51. The exposure and development device 72 subjects the resist film to exposure treatment and development treatment, thereby patterning the resist film to form a resist pattern. The etching device 73 etches the metal plate 51 using the resist pattern as a mask to form the through-holes 25 in the metal plate 51. The film strip device 74 strips a component provided for protecting portions of the metal plate 51 not to be etched, such as the resist pattern and the resin 54 which will be described later, against an etching solution. The separation device 75 performs a separation step of separating a portion of the metal plate 51 in which the plurality of through-holes 25 corresponding to a single metal mask 20 have been formed from the metal plate 51. The metal mask 20 can be obtained in this manner.

In one embodiment of the present disclosure, a large number of the through-holes 25 are formed such that a plurality of the metal masks 20 can be fabricated from the metal plate 51. In other words, the plurality of metal masks 20 are allocated to the metal plate 51. For example, the large number of through-holes 25 are formed in the metal plate 51 such that a plurality of the effective regions 22 are aligned in the width direction of the metal plate 51 and the effective regions 22 for the plurality of metal masks 20 are aligned in the length direction of the metal plate 51.

Hereinafter, each step of the method for manufacturing the metal mask 20 will be described in detail.

First, the rolled-up body 50 including the metal plate 51 rolled up around the shaft member 52 is prepared. The rolling method, the plating deposition method, or the like can be adopted as a method for fabricating the metal plate 51 having a desired thickness.

Figure 11:
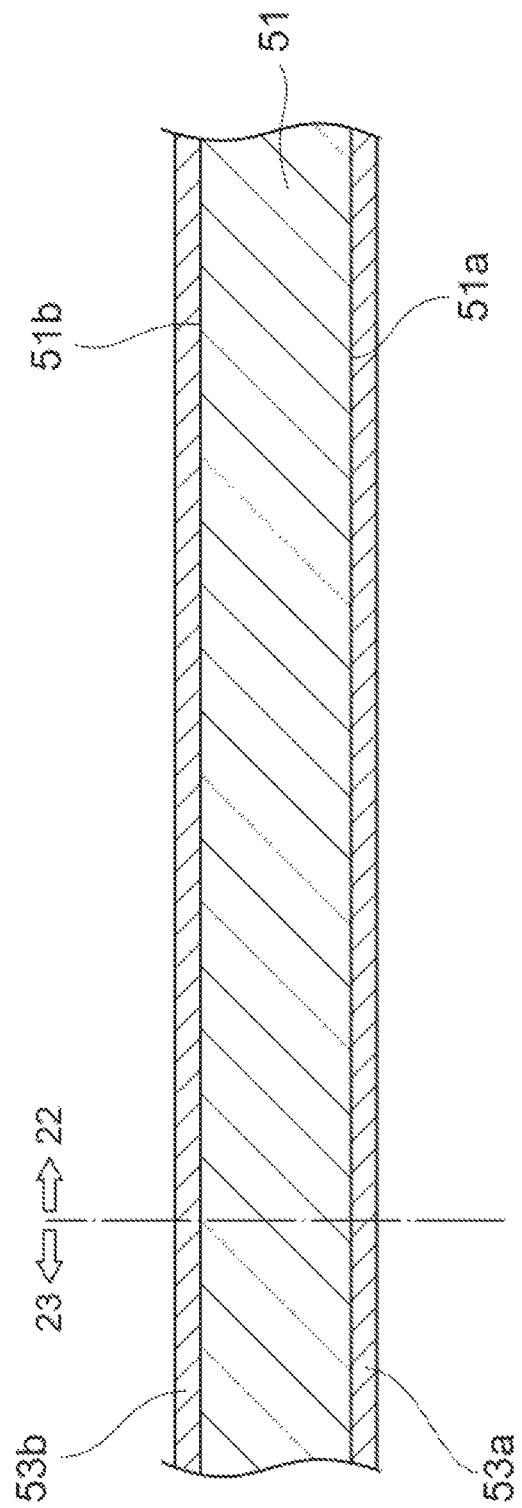
FIG. 11 is a diagram showing an example of a step of forming a resist film on a metal plate.

Subsequently, resist films 53a and 53b are formed as shown in FIG. 11 on the first surface 51a and the second surface 51b of the metal plate 51 pulled out from a pull-out device using the resist film forming device 71. The resist films 53a and 53b may be formed by bonding a dry film containing a photosensitive resist material such as an acrylic light curing resin, for example, onto the first surface 51a and the second surface 51b of the metal plate 51. Alternatively, the resist films 53a and 53b may be formed by, for example, coating the first surface 51a and the second surface 51b of the metal plate 51 with a coating solution containing a photosensitive resist material and drying the coating solution.

Although the resist films 53a and 53b may be of either a negative type or a positive type, the negative type is preferably used.

The thickness of the resist films 53a and 53b is 15 μm or less, for example, may be 10 μm or less, may be 6 μm or less, or may be 4 μm or less. In addition, the thickness of the resist films 53a and 53b is 1 μm or more, for example, may be 3 μm or more, may be 5 μm or more, or may be 7 μm or more. The range of the thickness of the resist films 53a and 53b may be determined by a combination of any one of the above-described plurality of upper-limit candidate values and any one of the above-described plurality of lower-limit candidate values.

Figure 12:
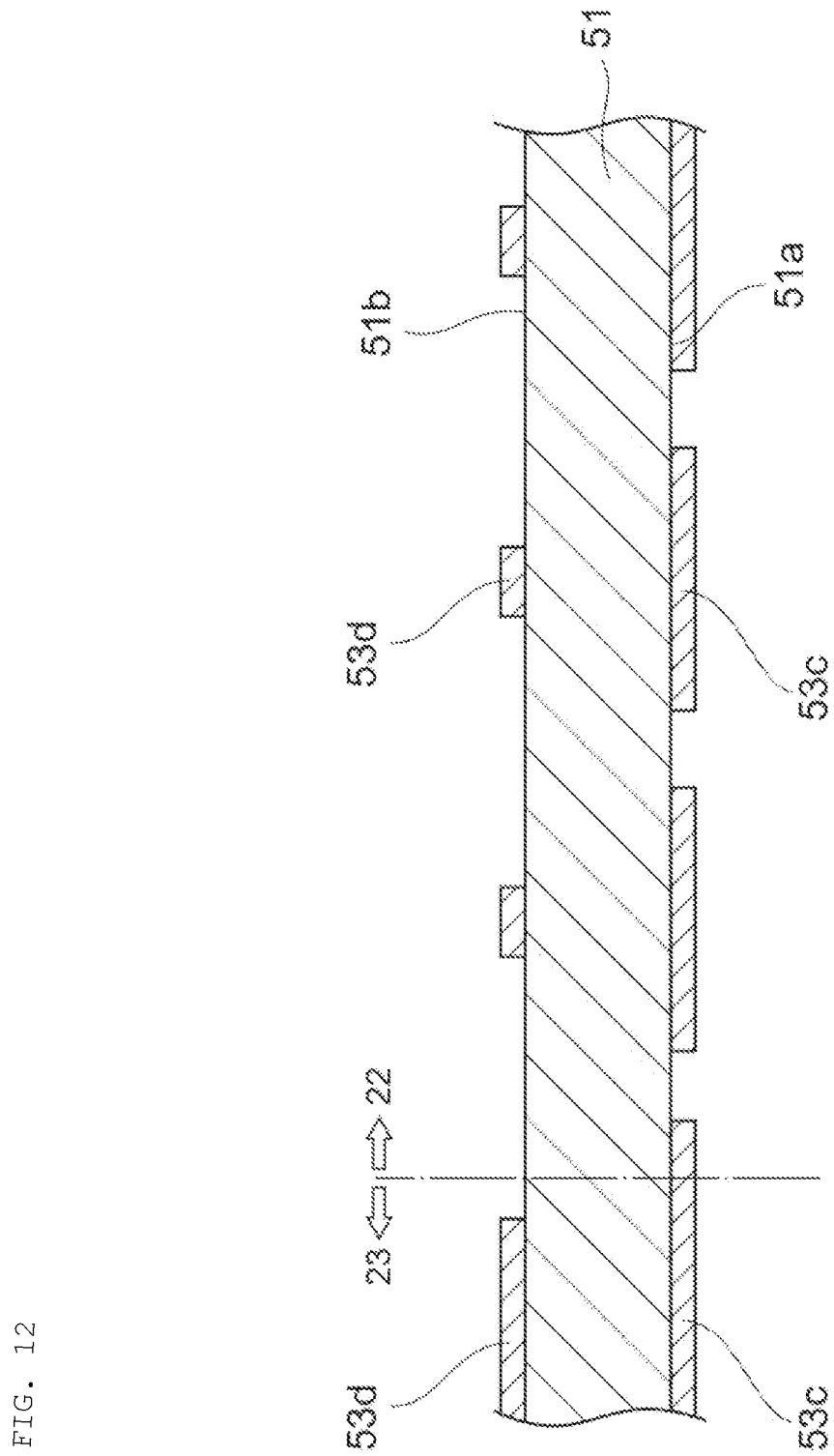
FIG. 12 is a diagram showing an example of a step of patterning the resist film.

Subsequently, the resist films 53a and 53b are exposed and developed using the exposure and development device 72. This enables a first resist pattern 53c to be formed on the first surface 51a of the metal plate 51 and a second resist pattern 53d to be formed on the second surface 51b of the metal plate 51, as shown in FIG. 12. In the case of using the negative type resist films, for example, glass substrates configured not to let light pass through to-be-moved regions of the resist films may be disposed on the resist films, so that the resist films may be exposed through the glass substrates, and the resist films may further be developed.

Subsequently, the etching step of etching the metal plate 51 using the etching device 73 with the first resist pattern 53c and the second resist pattern 53d serving as masks to thereby form the metal mask 20 is performed. The etching step may include a first surface etching step and a second surface etching step.

Figure 13:
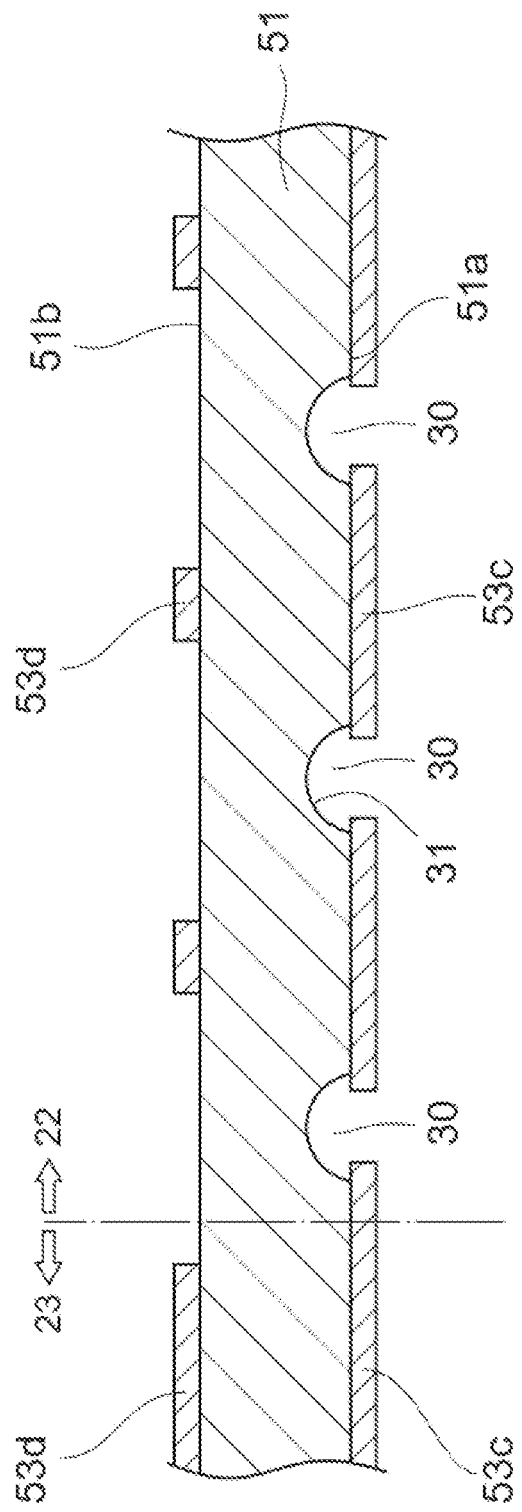
FIG. 13 is a diagram showing an example of a first surface etching step.

First, the first surface etching step is performed as shown in FIG. 13. In the first surface etching step, regions of the first surface 51a of the metal plate 51 which are not covered by the first resist pattern 53c are etched using a first etching solution. For example, the first etching solution is sprayed from a nozzle disposed on the side facing the first surface 51a of the metal plate 51 being conveyed toward the first surface 51a of the metal plate 51 through the first resist pattern 53c. On this occasion, the second surface 51b of the metal plate 51 may be covered by a film resistant to the first etching solution or the like.

As a result of the first surface etching step, erosion by the first etching solution progresses in the regions of the metal plate 51 which are not covered by the first resist pattern 53c as shown in FIG. 13. A large number of the first recesses 30 are thereby formed in the first surface 51a of the metal plate 51. A solution containing a ferric chloride solution and hydrochloric acid, for example, may be used as the first etching solution.

Figure 14:
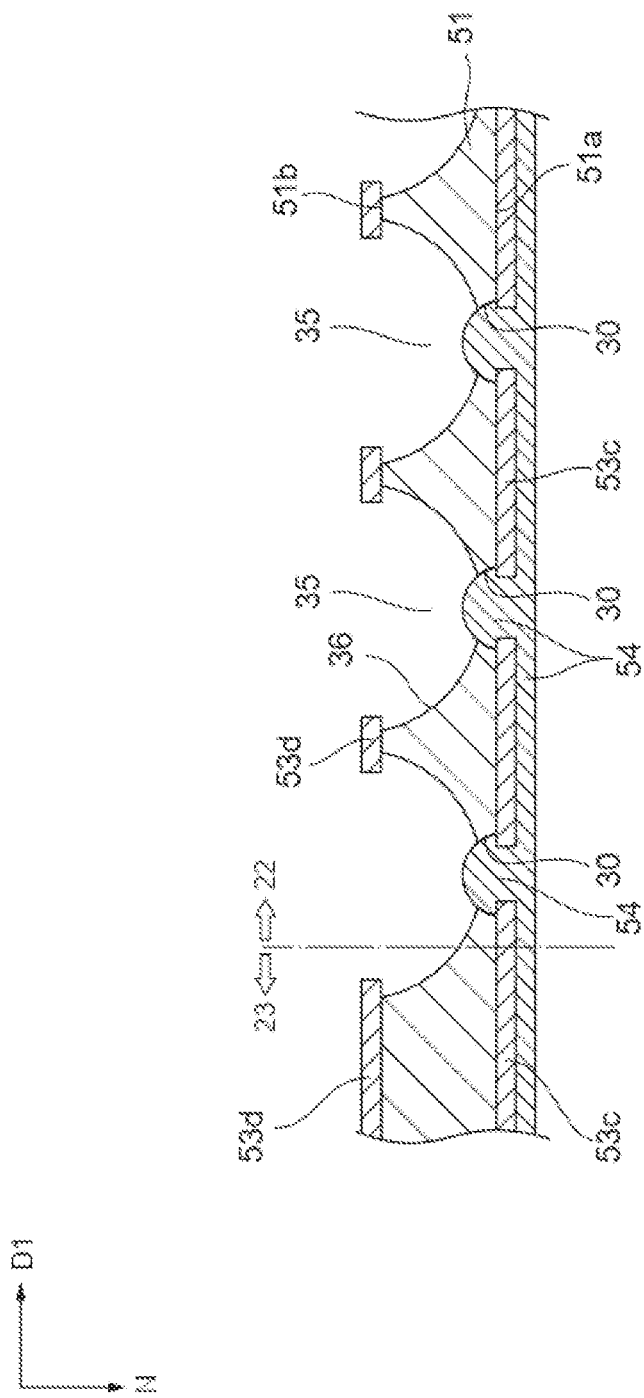
FIG. 14 is a diagram showing an example of a second surface etching step.

Next, the second surface etching step is performed as shown in FIG. 14. In the second surface etching step, regions of the second surface 51b of the metal plate 51 which are not covered by the second resist pattern 53d are etched using a second etching solution. The second recesses 35 are thereby formed in the second surface 51b of the metal plate 51. The second surface 51b is etched until the first recess 30 and the second recess 35 communicate with each other so that the through-holes 25 are formed accordingly. A solution containing a ferric chloride solution and hydrochloric acid, for example, may be used as the second etching solution, similarly to the above-described first etching solution. Note that when etching the second surface 51b, the first recesses 30 may be covered by the resin 54 resistant to the second etching solution as shown in FIG. 14.

In the second surface etching step, etching may be performed such that rib bars are formed as shown in FIG. 14. The rib bars formed in this manner can be the first top part 32a or the second top part 32b in the first region R1 and/or the second region R2. In this case, the area of a part of the second surface 51b remaining unetched becomes the area of the first top part 32a and the second top part 32b.

Figure 15:
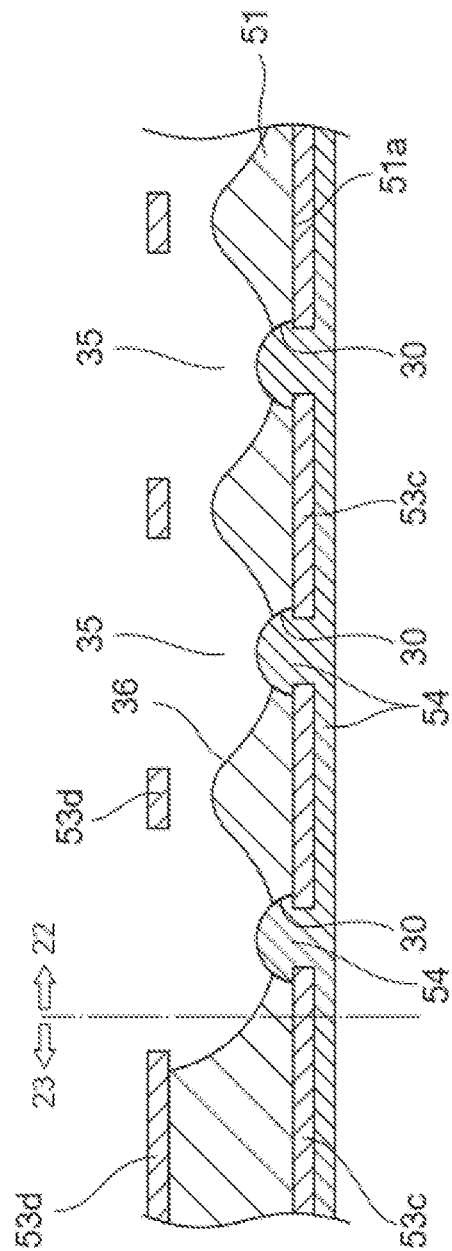
FIG. 15 is a diagram showing an example of a second surface etching step.

Alternatively, in the second surface etching step, etching may be performed so as to form a portion where the ridge line 33 formed by joining of adjacent ones of the second recesses 35 has the local maximum height in the first region R1 and/or the second region R2 as shown in FIG. 15. The portion of the ridge line 33 having the local maximum height formed in this manner can be the first top part 32a or the second top part 32b in the first region R1 and/or the second region R2.

The areas of the first top part 32a and the second top part 32b may be adjusted depending on the size and shape of holes in the second resist pattern 53d. Specifically, as the resist film positioned in the first region R1 and the second region R2 is wider, the second surface 51b remaining unetched in the first top part 32a and the second top part 32b is wider. As the resist film positioned in the first region R1 and the second region R2 is narrower, the second surface 51b remaining unetched in the first top part 32a and the second top part 32b is narrower. In the case where the resist film positioned in the first region R1 and the second region R2 is narrow, etching progresses in some cases such that adjacent two of the second recesses 35 are connected to each other.

With the above configuration, the area S1 of the top of the first top part 32a can be made larger than the area S2 of the top of the second top part 32b. In addition, θ1 and θ2 can also be adjusted.

Next, a method for manufacturing an organic EL display device using the metal mask 20 according to the present embodiment will be described with reference to FIG. 2. The organic EL display device may include, in a stacked manner, the substrate 92 and a vapor deposition layer including the vapor deposition material 98 provided in a pattern shape. The method for manufacturing the organic EL display device includes a vapor deposition step of vapor-depositing the vapor deposition material 98 on a substrate such as the substrate 92 using the metal mask 20.

In the vapor deposition step, the metal mask device 10 is disposed first such that the metal mask 20 is opposed to the substrate. The metal mask 20 may be brought into close contact with the substrate 92 using a magnet (not shown). The inside of the vapor deposition device 90 may be brought into a vacuum atmosphere. Evaporating the vapor deposition material 98 in this state to fly to the substrate 92 via the metal mask 20 enables the vapor deposition material 98 to adhere to the substrate 92 in a pattern corresponding to the through-holes 25 of the metal mask 20.

The method for manufacturing the organic EL display device may include various steps in addition to the vapor deposition step of vapor-depositing the vapor deposition material 98 on the substrate such as the substrate 92 using the metal mask 20. For example, the method for manufacturing the organic EL display device may include a step of forming a first electrode on the substrate. The vapor deposition layer is formed on the first electrode. The method for manufacturing the organic EL display device may include a step of forming a second electrode on the vapor deposition layer. The method for manufacturing the organic EL display device may include a sealing step of sealing the first electrode, the vapor deposition layer, and the second electrode provided on the substrate 92.

The vapor deposition layer formed on the substrate such as the substrate 92 using the metal mask 20 is not limited to the above-described light emitting layer, but may include other layers. For example, the vapor deposition layer may include a hole injection layer, a hole transport layer, a light emitting layer, an electron transport layer, an electron injection layer, and the like in this order from the first electrode side. In this case, vapor deposition steps through use of the metal masks 20 corresponding to the respective layers may be performed respectively.

Note that the above-described embodiment can be modified variously. Hereinafter, modifications will be described with reference to the drawings according to necessity. In the following description and the drawings used in the following description, a portion that may be configured similarly to the above-described embodiment is denoted by a reference character identical to the reference character used for the corresponding portion in the above-described embodiment, and repeated description is omitted. In the case where the action and effect obtained in the above-described embodiment are clearly achieved also in the modifications, the description thereof is omitted in some cases.

MODIFICATIONS

Although the rib bar has been described above in some cases as a main example of the first top part 32a, the first top part 32a does not need to be a rib bar, but as a first modification, may be a portion of the ridge line 33 formed by joining of adjacent ones of the second recesses 35 having the local maximum value as in the second top part 32b.

As a second modification, the step of forming the second recess 35 may be performed before the step of forming the first recess 30, or the step of forming the first recess 30 and the step of forming the second recess 35 may be performed in parallel.

As a third modification, laser light may be radiated to the inside of the first recess 30 or the second recess 35 using a laser designator, thereby causing laser light to reach another surface of the metal plate 51 from the inside of the first recess 30 or the second recess 35 to form a through-hole.

EXAMPLES

Hereinafter, the present disclosure will be described more specifically using examples and comparative examples. The present disclosure is not limited at all by the following examples.

EXAMPLES

Using the above-described method for manufacturing the metal mask, the first recesses and the second recesses were formed in the metal plate to manufacture the metal mask having the through-holes composed of the first recesses and the second recesses. On this occasion, the through-holes were formed in a pattern as shown in FIG. 6A, and the through-holes had a substantially rectangular shape with a short axis of 40 μm and a long axis of 50 μm.

The first top part and the second top part were formed as rib bars having the area S1 and the area S2 as described in Table 1 in the first region R1 and the second region R2. An invar material was used as the metal plate to be a raw material of the metal mask.

COMPARATIVE EXAMPLES

Metal masks were obtained similarly to the examples except that the area S1 of the first top part and the area S2 of the second top part had values described in Table 1.
(Evaluation of Strength)

The strength was evaluated using the metal masks fabricated in the examples and the comparative examples as described above. Specifically, whether a failure such as a rippling shape occurred or not when installing the metal masks on the frame was visually observed. Based on a result of the observation, the strength was evaluated in accordance with the following evaluation criteria.
(Evaluation Criteria)
A: a failure such as a rippling shape did not occur
D: a failure such as a rippling shape occurred
(Evaluation of Shadow)

The vapor deposition step of causing the vapor deposition material to adhere to the glass substrate to form the vapor deposition layer was performed using the metal masks fabricated in the examples and the comparative examples as described above. Subsequently, the ratio of length of the short axis to long axis of the vapor deposition layer with respect to the ratio of length of short axis to long axis of the through-hole was calculated. Then, based on the value, shadow was evaluated in accordance with the following evaluation criteria.

> Evaluation value=(the ratio of length of short axis to long axis of vapor deposition layer)/(the ratio of length of short axis to long axis of through-hole)

(Evaluation Criteria)
A: the evaluation value was 0.95 or more and 1.05 or less
B: the evaluation value was 0.90 or more and less than 0.95, or exceeded 1.05 and 1.10 or less
C: the evaluation value was 0.85 or more and less than 0.90, or exceeded 1.10 and 1.15 or less
D: the evaluation value was less than 0.85 or exceeded 1.15

TABLE 1

|  | T [μm] | H1 [μm] | H2 [μm] | θ1 [°] | θ2 [°] | S1 [μm²] | S2 [μm²] | S2/S1 | √S2/Short Axis | Strength | Shadow |
|---|---|---|---|---|---|---|---|---|---|---|---|
| Example 1 | 25 | 25 | 25 | 35.9 | 33.8 | 51.8 | 25.0 | 0.48 | 0.125 | A | A |
| Example 2 | 30 | 30 | 30 | 31.6 | 31.4 | 56.3 | 10.9 | 0.19 | 0.110 | A | A |
| Example 3 | 25 | 25 | 25 | 32.4 | 35.6 | 121.0 | 9.0 | 0.07 | 0.100 | A | A |
| Example 4 | 20 | 20 | 20 | 49.4 | 50.2 | 225.0 | 25.0 | 0.11 | 0.125 | A | A |
| Example 5 | 50 | 50 | 50 | 54.5 | 51.2 | 64.0 | 9.0 | 0.14 | 0.067 | A | A |
| Example 6 | 25 | 25 | 17 | 32.4 | 51.4 | 121.0 | 0.0 | 0.00 | 0.000 | A | A |
| Comparative Example 1 | 25 | 25 | 25 | 34.3 | 30.0 | 49.0 | 49.0 | 1.00 | 0.233 | A | D |
| Comparative Example 2 | 25 | 25 | 25 | 32.4 | 30.0 | 121.0 | 81.0 | 0.67 | 0.300 | A | D |
| Comparative Example 3 | 30 | 30 | 30 | 32.6 | 29.5 | 900.0 | 729.0 | 0.81 | 0.491 | A | D |

As described above, it is understood that the metal masks of the examples in which the ratio (S2/S1) was 0.65 or less is excellent in strength and can prevent shadow. On the other hand, it is understood that in the metal masks of Comparative Examples 1 to 3 in which the ratio (S2/S1) exceeded 0.65, shadow is likely to occur although the strength can be ensured.

Further, the metal masks of Examples 1 to 5 in which the ratio (S2/S1) exceeded 0 were less likely to cause a minute recess or bending that would partially occur when an external force was applied than in Example 6 in which the ratio (S2/S1) was 0.

INDUSTRIAL APPLICABILITY

The metal mask of the present invention has industrial applicability as a metal mask to be used for manufacturing an organic EL display device, and the like.

What is claimed is:

1. A metal mask including a first surface, and a second surface positioned opposite to the first surface, wherein
the first surface has through-holes, a first top part, and a second top part,
the through-holes have a first through-hole, a second through-hole, a third through-hole, a fourth through-hole, a fifth through-hole, and a sixth through-hole,
the first through-hole has a first short axis and a first long axis,
the second through-hole has a second short axis and a second long axis,
the third through-hole has a third short axis and a third long axis,
the fourth through-hole has a fourth short axis and a fourth long axis,
the fifth through-hole has a fifth short axis and a fifth long axis,
the sixth through-hole has a sixth short axis and a sixth long axis,
the first long axis is parallel to the second long axis and positioned next to the second long axis in a direction D2 crossing the first long axis,
the first short axis is parallel to the fifth short axis and positioned next to the fifth short axis in a direction D1 parallel to the first long axis,
the third long axis is parallel to the fourth long axis and positioned next to the fourth long axis in the direction D1 parallel to the first long axis,
the third short axis is parallel to the sixth short axis and positioned next to the sixth short axis in the direction D2 crossing the first long axis,
the first top part is positioned between the first long axis and the second long axis and between the third long axis and the fourth long axis,
the second top part is positioned between the first short axis and the fifth short axis and between the third short axis and the sixth short axis, and
a ratio (S2/S1) of an area S2 of a top of the second top part to an area S1 of a top of the first top part is 0.65 or less.

2. The metal mask according to claim 1, wherein the first top part and the second top part are alternately present in a direction D3 passing through the first top part and the second top part.

3. The metal mask according to claim 2, wherein the direction D1 and the direction D3 make an acute angle of 30° or more and 60° or less.

4. The metal mask according to claim 1, wherein (the area S2)$^{1/2}$ is 1.00 times a length of the first short axis or less.

5. The metal mask according to claim 1, wherein the through-holes each have a substantially rectangular or substantially elliptical opening shape.

6. A method for manufacturing the metal mask according to claim 1, comprising:
a step of preparing a metal plate including a first surface and a second surface positioned opposite to the first surface; and
an etching step of etching the metal plate to form the metal mask, wherein
the metal mask has the first surface and the second surface positioned opposite to the first surface,
the first surface has the through-holes, the first top part, and the second top part,
the through-holes have the first through-hole, the second through-hole, the third through-hole, the fourth through-hole, the fifth through-hole, and the sixth through-hole,
the first through-hole has the first short axis and the first long axis,
the second through-hole has the second short axis and the second long axis,
the third through-hole has the third short axis and the third long axis,
the fourth through-hole has the fourth short axis and the fourth long axis,
the fifth through-hole has the fifth short axis and the fifth long axis,
the sixth through-hole has the sixth short axis and the sixth long axis,
the first long axis is parallel to the second long axis and positioned next to the second long axis in the direction D2 crossing the first long axis, the first short axis is parallel to the fifth short axis and positioned next to the fifth short axis in the direction D1 parallel to the first long axis, the third long axis is parallel to the fourth long axis and positioned next to the fourth long axis in the direction D1 parallel to the first long axis, the third short axis is parallel to the sixth short axis and positioned next to the sixth short axis in the direction D2 crossing the first long axis, the first top part is positioned between the first long axis and the second long axis and between the third long axis and the fourth long axis, the second top part is positioned between the first short axis and the fifth short axis and between the third short axis and the sixth short axis, and the ratio (S2/S1) of the area S2 of the top of the second top part to the area S1 of the top of the first top part is 0.65 or less.

\* \* \* \* \*